United States Patent [19]

Kitaoka et al.

[11] Patent Number: 5,387,998
[45] Date of Patent: Feb. 7, 1995

[54] SHORTER WAVELENGTH LIGHT GENERATING APPARATUS IN WHICH COHERENT LIGHT IS CONVERTED INTO SHORTER WAVELENGTH LIGHT

[75] Inventors: Yasuo Kitaoka; Kazuhisa Yamamoto; Kiminori Mizuuchi, all of Osaka; Makoto Kato, Nishinomiya, all of Japan

[73] Assignee: Matsushita Electric Industrial Co., Ltd., Osaka, Japan

[21] Appl. No.: 76,666

[22] Filed: Jun. 15, 1993

[30] Foreign Application Priority Data

Jun. 17, 1992 [JP] Japan .................................. 4-157686
Mar. 24, 1993 [JP] Japan .................................. 5-064926

[51] Int. Cl.6 .......................... G02F 1/37; H01S 3/109
[52] U.S. Cl. ..................... 359/328; 372/22; 385/122
[58] Field of Search ........................ 359/326–332; 385/122; 372/21, 22

[56] References Cited

U.S. PATENT DOCUMENTS

| 3,611,181 | 10/1971 | Lary et al. | 372/102 |
| 4,907,238 | 3/1990 | Chun et al. | 372/21 X |
| 5,206,868 | 4/1993 | Deacon | 372/21 |
| 5,231,643 | 7/1993 | Naya et al. | 372/22 X |
| 5,233,620 | 8/1993 | Shinozaki et al. | 372/22 |
| 5,235,456 | 8/1993 | Guyer et al. | 359/330 |

FOREIGN PATENT DOCUMENTS

| 473441 | 3/1992 | European Pat. Off. |
| 1-257922 | 10/1989 | Japan |
| 2-209784 | 8/1990 | Japan |
| 4-107536 | 4/1992 | Japan |

OTHER PUBLICATIONS

"Wide Range Frequency Tunable DSM Laser Diode" by H. Asakura et al; Institute of electronics, Information and communication Engineers of Japan (National Meeting (1987) (English abstract is attached.).

"Milliwatt–Order Blue–Light Generation In a Periodically Domain–Inverted $LiTaO_3$ Waveguide" by K. Yamamoto et al; Optics Letters/vol. 16, No. 15/Aug. 1, 1991, 3 pp.

IEEE Journal of Quantum Electronics, vol. 26, No. 7, Jul. 1990, pp. 1265–1276, Suhara et al.

IEEE Journal of Quantum Electronics, vol. 26, No. 10, Oct. 1990, pp. 1747–1755, Hori et al.

Proceedings of the Conference on Lasers and Electro–Optics, vol. 11, Apr. 1989, p. 350, paper $Th_{O3}$, Magel et al.

*Primary Examiner*—John D. Lee
*Attorney, Agent, or Firm*—Lowe, Price, LeBlanc & Becker

[57] ABSTRACT

A shorter wavelength light generating apparatus consists of a semiconductor laser for initially radiating various modes of coherent light including a required mode of coherent light, a reflection type of diffraction grating for diffracting and reflecting the various modes of coherent light to selectively feed back the required mode of coherent light to the semiconductor laser which is induced by the coherent light fed back to dominantly radiate the required mode of coherent light, and an optical wavelength type of wavelength converting device for converting a part of the required mode of coherent light radiated from the semiconductor laser into shorter wavelength light. The required mode of coherent light not converted is radiated to the diffraction grating. Accordingly, even though the various modes of coherent light are initially radiated from the semiconductor laser, the required mode of coherent light is dominantly radiated from the semiconductor laser after a short time. Therefore, the shorter wavelength light is stably output while stabilizing the wavelength of the shorter wavelength light.

33 Claims, 9 Drawing Sheets

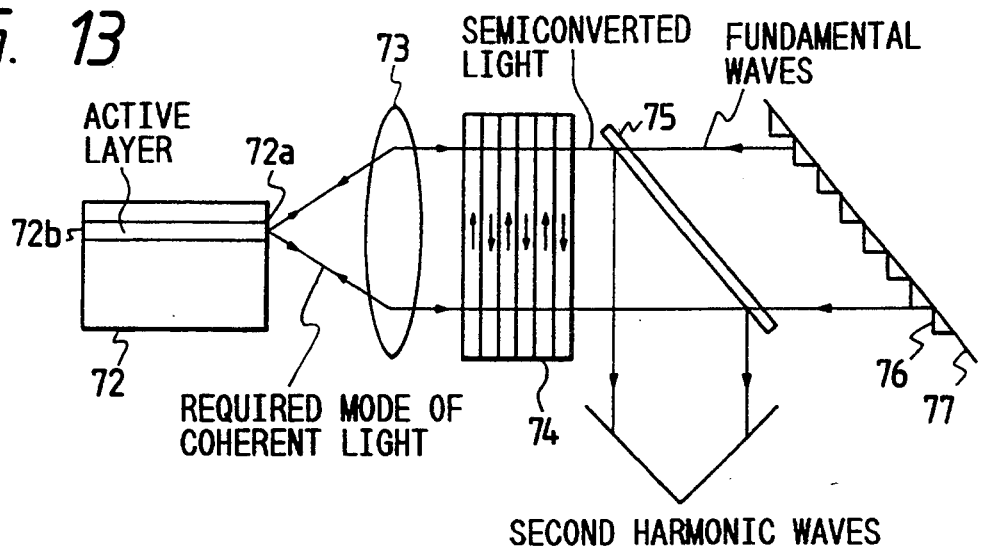
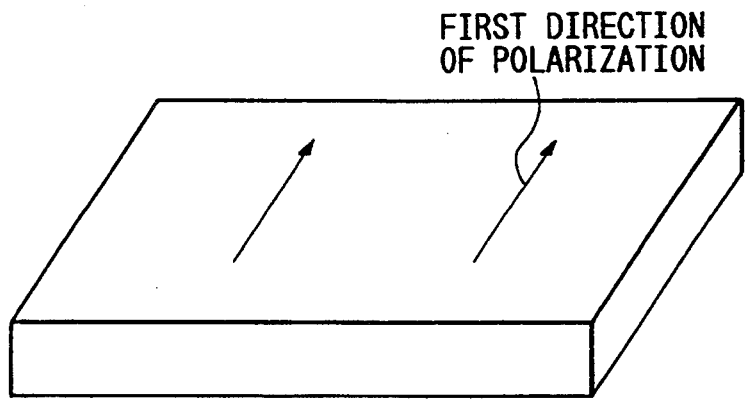
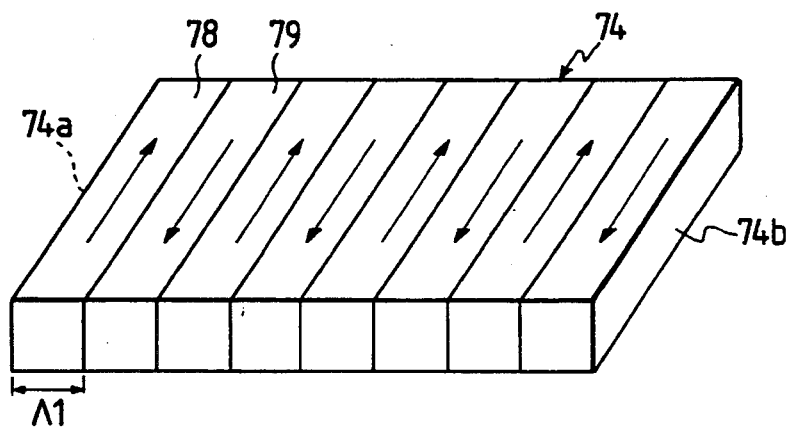

SHORTER WAVELENGTH LIGHT GENERATING APPARATUS IN WHICH COHERENT LIGHT IS CONVERTED INTO SHORTER WAVELENGTH LIGHT

BACKGROUND OF THE INVENTION

1. Field of the Invention

The present invention relates generally to a shorter wavelength light generating apparatus for stably generating shorter wavelength light utilized for high-density optical disk system, and more particularly to a shorter wavelength light generating apparatus in which a fundamental wave radiated from a semiconductor laser is converted into a second harmonic wave.

2. Description of the Related Art

Coherent green light and coherent blue light are required to read pieces of information stored in an optical disk in a high density or to process pictures. The coherent green light and the coherent blue light are produced by efficiently converting a fundamental wave radiated from a semiconductor laser into shorter wavelength light such as a second harmonic wave with a wavelength converting device. Coherent light radiated from a semiconductor laser consists of a fundamental wave. Also, harmonic waves such as a second harmonic wave have been known. A wavelength $\lambda_f$ of the fundamental wave is longer than those of the harmonic waves, and each of wavelengths of the harmonic waves is defined as a multiple of the wavelength $\lambda_f$ of the fundamental wave. For example, the wavelength $\lambda_h$ of the second harmonic wave is half of the wavelength $\lambda_f$ of the fundamental wave. Therefore, the coherent green light or the coherent blue light is generated from infrared radiation by converting the fundamental wave having a wavelength of 860 nm into the second harmonic wave having a wavelength of 430 nm in the wavelength converting device.

In this case, to efficiently output shorter wavelength light from coherent light generated in the semiconductor laser, a transverse mode of the shorter wavelength light is required to be distributed in a Gaussian distribution, the shorter wavelength light diffracted in a diffraction-limited range is required to be focused, and the shorter wavelength light having an output power of over 1 mW and a stabilized wavelength is required to be stably output.

To obtain the shorter wavelength light having the output power of over 1 mW, an optical waveguide type of wavelength converting device, a bulk element type of wavelength converting device, and KNbO₃ have been conventionally utilized. Those devices and KNbO₃ are respectively formed of a large bulk of crystal having a non-linear polarization constant. The optical waveguide type of wavelength converting device has alternate rows of reverse and non-reverse polarization layers arranged at regular intervals in an optical waveguide, and a fundamental wave of semiconductor laser is converted into a second harmonic wave in the optical waveguide according to a quasi-phase matching (Yamamoto et. al. Optics Letters, Vol. 16, No. 15, 1156 (1991)). Also, the bulk element type of wavelength converting device has alternate rows of reverse and non-reverse polarization layers arranged at regular intervals, and a fundamental wave of semiconductor laser is also converted into a second harmonic wave according to the quasi-phase matching.

Also, a shorter wavelength light generating apparatus in which the wavelength of the shorter wavelength light generated is changeable is required for a measuring field such as high-resolution gas spectroscopy and atmospheric pollution monitoring.

2.1. Previously Proposed Art:

FIG. 1 schematically shows the configuration of a conventional shorter wavelength light generating apparatus in which a fundamental wave generated in a semiconductor laser is converted into shorter wavelength light such as a second harmonic wave in an optical waveguide type of wavelength converting device.

As shown in FIG. 1, a conventional shorter wavelength light generating apparatus 11 is provided with a semiconductor laser 12 for radiating coherent light having a pumping power of 35 mW, a collimator lens 13 for collimating the coherent light, a λ/2 polarizer 14 for polarizing the coherent light by 90 degrees, a focusing lens 15 having a numerical aperture of NA=0.6 for focusing the coherent light, an optical waveguide type of wavelength converting device 16 for converting a fundamental wave of the coherent light into a second harmonic wave.

In the above configuration, coherent light radiated from the semiconductor laser 12 are collimated in the collimator lens 13, and the coherent light collimated are polarized by 90 degrees in the λ/2 polarizer 14. Thereafter, the coherent light polarized are focused by the focusing lens 15 on an optical waveguide at an input end face 16a of the wavelength converting device 16. In the optical waveguide of the device 16, the coherent light focused are converted into shorter wavelength light such as blue light. Therefore, the blue light is radiated from an output end face 16b of the device 16. In this case, an anti-reflection coat is applied on the input end face 16a of the device 16 to prevent a part of the coherent light focused on the input end face of the device 16 from being fed back to the semiconductor laser 12. However, approximately 1% of the coherent light focused on the input end face 16a of the device 16 is fed back to the semiconductor laser source 12 in practical use.

Accordingly, the coherent light such as infrared radiation can be reliably converted into the blue light. For example, when the pumping power of the coherent light radiated to the input end face 16a of the device 16 is 35 mW, the pumping power of the blue light radiated from the output end face 16b of the device 16 is 1.1 mW.

2.2. Another Previously Proposed Art:

Also, a semiconductor laser, from which coherent light having a fixed wavelength is stably radiated in a single longitudinal mode even though ambient temperature of a semiconductor laser is varied, is required for an optical communication field. For example, an outer resonance type of semiconductor laser has been proposed to stably oscillate coherent light (Asakura et. al., National Meeting (1987), Institute of Electronics, Information and Communication Engineers of Japan).

FIG. 2 schematically shows the configuration of a conventional outer resonance type of semiconductor laser.

As shown in FIG. 2, a conventional outer resonance type of semiconductor laser 21 is provided with a Fabry-PeFrot type of semiconductor laser 22 for radiating a required amplification mode of coherent light having a peculiar wavelength of 1.3 μm, a collimator lens 23 having a numerical aperture of NA=0.6 for collimating the coherent light, an outer resonance mirror 24 inclined from an optical axis of the coherent light, and a reflection type of diffraction grating 25 arranged on the outer resonance mirror 24 for diffracting the coherent light in dependence on wavelength of the coherent light and reflecting the coherent light diffracted. An anti-reflection coat is applied on a first end face 22a of the semiconductor laser 22 facing the collimator lens 23. A large number of slits are digged in parallel on the outer resonance mirror 24 to form the diffraction grating 25.

In the above configuration, various amplification modes of coherent light including a required amplification mode of coherent light are initially radiated from the first end face 22a of the semiconductor laser 22. Each of the modes of coherent light has a wavelength. The various amplification modes of coherent light initially radiated from an active layer at the first end face 22a of the semiconductor laser 22 are collimated by the collimator lens 23, and the various amplification modes of coherent light collimated pass through an optical path. Thereafter, the various amplification modes of coherent light are diffracted and reflected by the diffraction grating 25 in various reflection directions. The reflection directions of the various amplification modes of coherent light depend on a pitch of the diffraction grating 25 and an inclined angle of the outer resonance mirror 24 from the optical axis of the coherent light.

In this case, the required amplification mode of coherent light having the particular wavelength of 1.3 μm is reflected to the same optical path as that of the coherent light radiated to the diffraction grating 25, according to a wavelength dispersion effect. Thereafter, the required amplification mode of coherent light is again collimated by the collimator lens 23, and the required amplification mode of coherent light collimated is focused on the active layer at the first end face 22a of the semiconductor laser 22. Therefore, the required amplification mode of coherent light is fed back to the semiconductor laser 22. In contrast, the other various modes of coherent light are not focused on the active layer of the semiconductor laser 22 because the wavelength of the required amplification mode of coherent light differs from those of the other various modes of coherent light. Therefore, the other various amplification modes of coherent light are not fed back to the semiconductor laser 22. As a result, the required amplification mode of coherent light is dominantly radiated from the semiconductor laser 22.

Thereafter, the required amplification mode of coherent light dominantly amplified in the semiconductor laser 22 are radiated from an opposite end face 22b of the semiconductor laser 22.

Accordingly, the required amplification mode of coherent light can be selectively radiated from the conventional outer resonance type of semiconductor laser 21.

Next, a method for manufacturing the diffraction grating 25 is described as follows.

A patterned resist layer is coated on a Si substrate. The patterned resist layer prevents the Si substrate from being etched by electron beams radiated to the Si substrate. Therefore, when the electron beams are radiated to the Si substrate, the Si substrate not coated by the patterned resist layer is etched to form the diffraction grating 25. Thereafter, the patterned resist layer is taken away from the Si substrate. Thereafter, a thin film of Au is deposited on the diffraction grating 25 to efficiently reflect coherent light.

2.3. Third Previously Proposed Art:

FIG. 3 schematically shows the configuration of another conventional outer resonance type of semiconductor laser.

As shown in FIG. 3, a conventional outer resonance type of semiconductor laser 31 is provided with the semiconductor laser 22, an outer resonance mirror 32 inclined from an optical axis of the coherent light, and a diffraction grating 33 arranged on the outer resonance mirror 32 for diffracting and reflecting the coherent light. A large number of circular slits are concentrically digged on the outer resonance mirror 24 to form the diffraction grating 33.

In the above configuration, because any collimator lens is not arranged between the semiconductor laser 22 and the diffraction grating 33, the coherent light is radiated to the diffraction grating 33 while spreading out in conical shape. However, because the coherent light not collimated are diffracted by the diffraction grating 33 formed of the circular slits digged in concentric circle shape, the required amplification mode of coherent light diffracted are selectively focused on the active layer at the first end face 22a of the semiconductor laser 22. Therefore, the required amplification mode of coherent light are dominantly induced in the semiconductor laser 22 and are radiated from the opposite end face 22b of the semiconductor laser 22.

Accordingly, because any collimator lens is not arranged, a resonance length defined as a distance between the opposite end face 22b of the semiconductor laser 22 and the diffraction grating 33 can be shortened. Therefore, the coherent light radiated from the semiconductor laser 22 can be easily modulated at high as compared with in the conventional outer resonance type of semiconductor laser 21. As a result, a modulation frequency of the coherent light utilized as a modulated wave can be increased (Japan Patent Application No. 30547 of 1989 laid open to public inspection on Aug. 21, 1990 under Provisional Publication No. 209784/90, title "Outer Resonance Type of Semiconductor Laser and Multiple-Wavelength Lights Transmitter).

2.4. Problems to be Solved by the Invention:

However, there are drawbacks in the conventional shorter wavelength light generating apparatus 11. That is, because the shorter wavelength light is produced by converting and multiplying the coherent light in the wavelength converting device 16 in which the alternated rows of reverse and non-reverse polarization layers arranged at regular intervals, a wavelength range of the coherent light allowed for obtaining the shorter wavelength light is only 0.2 nm in the device 16. Also, the wavelength of the coherent light radiated from the semiconductor laser 12 is fluctuated depending on the ambient temperature of the semiconductor laser 12. The fluctuation ratio of the wavelength to the ambient temperature is about 0.2 nm/°C. Therefore, in cases where the ambient temperature of the semiconductor laser 12 varies by 1° C., the shorter wavelength light cannot be produced in the device 16.

In addition to the fluctuation of the ambient temperature, the amplification mode of the coherent light radiated from the semiconductor laser 12 varies because approximately 1% of the coherent light focused on the input end face 16a of the device 16 is fed back to the semiconductor laser source 12. In this case, the wavelength of the coherent light radiated from the semiconductor laser 12 varies about 1 nm after a short time. Therefore, the stable conversion period of the coherent light is no more than several seconds.

Accordingly, the stabilization of the wavelength of the coherent light is required to stably generate shorter wavelength light in the conventional shorter wavelength light generating apparatus 11.

Also, the wavelength range of the coherent light allowed for obtaining the shorter wavelength light is narrow in the bulk element type of wavelength converting device and KNbO$_3$. Therefore, the stabilization of the wavelength of the coherent light is required to stably generate shorter wavelength light by utilizing the bulk element type of wavelength converting device or KNbO$_3$.

In addition, only a fixed wavelength of coherent light is dominantly radiated from a semiconductor laser unless the ambient temperature of the semiconductor laser or a biasing current applied to the semiconductor laser is changed. Therefore, to manufacture a shorter wavelength light generating apparatus in which the wavelength of shorter wavelength light generated is changeable, the ambient temperature of the semiconductor laser put in the shorter wavelength light generating apparatus is required to be controlled under control of a controller. In this case, a shorter wavelength light generating apparatus having the controller becomes large so that the apparatus cannot be cheaply manufactured.

SUMMARY OF THE INVENTION

A first object of the present invention is to provide, with due consideration to the drawbacks of such a conventional shorter wavelength light generating apparatus, a shorter wavelength light generating apparatus in which shorter wavelength light having a stabilized wavelength is stably generated at high efficiency.

Also, a second object of the present invention is to provide a shorter wavelength light generating apparatus in which the wavelength of shorter wavelength light generated is simply changed.

The first object of the present invention is achieved by the provision of a shorter wavelength light generating apparatus, comprising:
 coherent light radiating means for initially radiating a required mode of coherent light and other various modes of coherent light, a wavelength of the required mode of coherent light differing from those of the other various modes of coherent light;
 light diffracting means for diffracting the required mode of coherent light radiated from the coherent light radiating means at a feedback angle of diffraction to feed back the required mode of coherent light diffracted to the coherent light radiating means and diffracting the other various modes of coherent light radiated from the coherent light radiating means at an abandoned angle of diffraction to abandon the other various modes of coherent light diffracted, the required mode of coherent light fed back to the coherent light radiating means inducing the coherent light radiating means to dominantly radiate the required mode of coherent light; and
 wavelength converting means for converting a part of the required mode of coherent light dominantly radiated from the coherent light radiating means in cooperation with the light diffracting means into shorter wavelength light of which a wavelength is shorter than that of the required mode of coherent light, the shorter wavelength light being output.

In the above configuration, various modes of coherent light including a required mode of coherent light are initially generated in and radiated from the coherent light radiating means. Each of the various modes of coherent light has a wavelength. Thereafter, the various modes of coherent light are radiated to the light diffracting means after the various modes of coherent light pass through the wavelength converting means. In the light diffracting means, the various modes of coherent light are diffracted at various angles of diffraction in dependence on the wavelengths of the various modes of coherent light.

In detail, the required mode of coherent light is diffracted at a feedback angle of diffraction so that the required mode of coherent light diffracted is fed back to the coherent light radiating means so that the induced emission is caused by the required mode of the coherent light fed back to the coherent light radiating means. In contrast, the other various modes of coherent light are diffracted at abandoned angles of diffraction so that the other various modes of coherent light diffracted are abandoned without being fed back to the coherent light radiating means. As a result, the required mode of coherent light is dominantly radiated from the coherent light radiating means.

Accordingly, even though the various modes of coherent light are initially generated in and radiated from the coherent light radiating means, the required mode of coherent light is dominantly radiated from the coherent light radiating means after a short time in cooperation with the light diffracting means.

Thereafter, a part of the required mode of coherent light dominantly radiated from the coherent light radiating means is converted into shorter wavelength light of which a wavelength is shorter than that of the required mode of coherent light. The required mode of coherent light not converted is radiated to the light diffracting means and is fed back to the coherent light radiating means. Also, the shorter wavelength light is output.

Accordingly, the shorter wavelength light can be stably output while the wavelength of the shorter wavelength light is stabilized.

The first and second objects of the present invention is achieved by the provision of a shorter wavelength light generating apparatus for generating shorter wavelength light of which a wavelength is changeable, comprising:
 a semiconductor laser for initially radiating various modes of coherent light including a required mode of coherent light, a wavelength of the required mode of coherent light differing from those of the other various modes of coherent light;
 a reflection type of diffraction grating for diffracting the various modes of coherent light radiated from the semiconductor laser at various angles of diffraction and reflecting the various modes of coherent light diffracted;
 a rotating base for adjustably inclining the reflection type of diffraction grating to selectively feed back the required mode of coherent light to the semiconductor laser, the required mode of coherent light fed back to the semiconductor laser inducing the semiconductor laser to dominantly radiate the required mode of coherent light; and wavelength converting device composed of a plurality of regions which each has a group of alternate rows of reverse and non-reverse polarization layers arranged at regular intervals, the regular intervals of a group of alternate rows differing from those of the other groups of alternate rows, and a part of the required mode of coherent light dominantly radiated from the semiconductor laser being converted into the shorter wavelength light in one of the groups of alternate rows.

In the above configuration, various modes of coherent light including a required mode of coherent light are initially generated in and radiated from the semiconductor laser. Each of the various modes of coherent light has a wavelength. Also, the mirror mounting the diffraction grating is adjustably rotated in advance so that the diffraction grating is inclined so as to selectively feed back the required mode of coherent light radiated to the diffraction grating to the semiconductor laser. Thereafter, the various modes of coherent light are radiated to the reflection type of diffraction grating after the various modes of coherent light pass through the wavelength converting devices. In the reflection type of diffraction grating, the various modes of coherent light are diffracted and reflected at various angles of diffraction in dependence on the wavelengths of the various modes of coherent light. Specifically, the required mode of coherent light is diffracted and reflected at a feedback angle. Therefore, the required mode of coherent light is fed back to the semiconductor laser so that the induced emission is caused by the required mode of the coherent light fed back to the semiconductor laser. In contrast, the other various modes of coherent light are diffracted and reflected at abandoned angles of diffraction so that the other various modes of coherent light diffracted are abandoned without being fed back to the semiconductor laser. As a result, the required mode of coherent light is dominantly radiated from the coherent light radiating means.

Accordingly, even though the various modes of coherent light are initially generated in and radiated from the semiconductor laser, the required mode of coherent light is dominantly radiated from the semiconductor laser after a short time in cooperation with the diffraction grating.

Thereafter, the required mode of coherent light dominantly radiated from the semiconductor laser pass through the wavelength converting device. In the wavelength converting device, there are many groups of alternate rows, and each of groups of alternate rows is arranged at regular intervals. Therefore, even though any mode of coherent light is selected as the required mode of coherent light from among the various modes of coherent light, a part of the required mode of coherent light selected is necessarily converted into the short wavelength light in a group of alternate rows because the wavelength of the required mode of coherent light optically agrees with the regular intervals of the group of the alternate rows. A wavelength of the shorter wavelength light is shorter than that of the required mode of coherent light. The required mode of coherent light not converted is radiated to the diffraction grating and is fed back to the semiconductor laser. Also, the shorter wavelength light is output.

Accordingly, the shorter wavelength light can be stably output while the wavelength of the shorter wavelength light is changeably adjusted by rotating the mirror.

BRIEF DESCRIPTION OF THE DRAWINGS

The objects, features and advantages of the present invention will be apparent from the following description taken in conjunction with the accompanying drawings, in which:

FIG. 13 schematically shows the configuration of a shorter wavelength light generating apparatus according to a third embodiment of the present invention;

FIGS. 14A, 14B are respectively a diagonal view showing a producing method of a wavelength converting device shown in FIG. 13;

DETAIL DESCRIPTION OF THE PREFERRED EMBODIMENTS

Preferred embodiments of a shorter wavelength light generating apparatus according to the present invention are described with reference to drawings.

Figure 1:
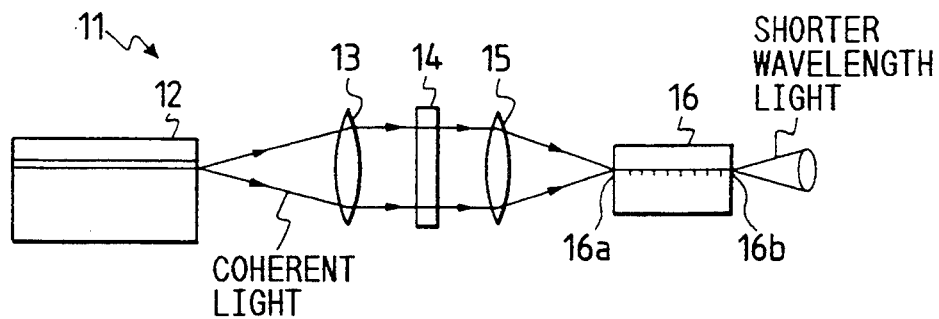
FIG. 1 schematically shows the configuration of a conventional shorter wavelength light generating apparatus in which a fundamental wave generated in a semiconductor laser is converted into shorter wavelength light such as a second harmonic wave in an optical waveguide type of wavelength converting device.
Figure 2:
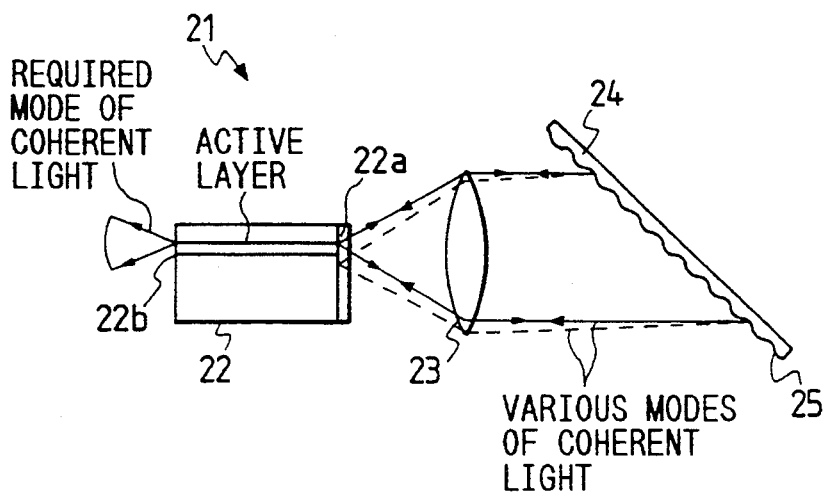
FIG. 2 schematically shows the configuration of a conventional outer resonance type of semiconductor laser.
Figure 3:
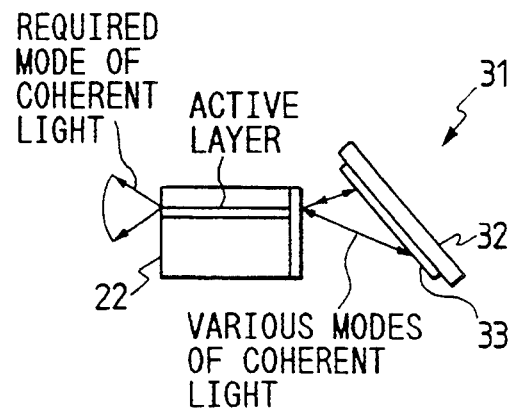
FIG. 3 schematically shows the configuration of another conventional outer resonance type of semiconductor laser.
Figure 4:
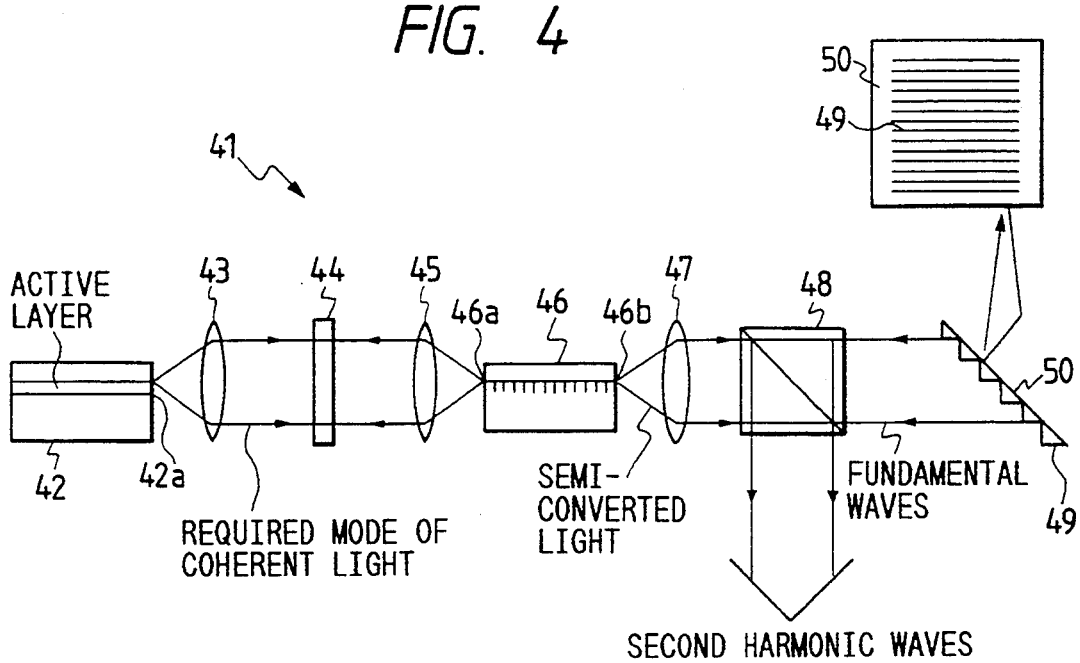
FIG. 4 schematically shows the configuration of a shorter wavelength light generating apparatus according to a first embodiment of the present invention.

FIG. 4 schematically shows the configuration of a shorter wavelength light generating apparatus according to a first embodiment of the present invention, a fundamental wave generated in a semiconductor laser is converted into shorter wavelength light such as a second harmonic wave in an optical waveguide type of wavelength converting device of the apparatus.

As shown in FIG. 4, a shorter wavelength light generating apparatus 41 comprises an AlGaAs semiconductor laser 42 for radiating a required mode of coherent light having a wavelength of $\lambda_f = 0.86$ μm at a pumping power of 50 mW, a first collimator lens 43 having a numerical aperture of NA=0.6 for collimating the coherent light radiated from the semiconductor laser 42, a $\lambda/2$ polarizer 44 for rotatively polarizing by 90 degrees the coherent light collimated by the first collimator lens 43, a focusing lens 45 having a numerical aperture of NA=0.6 for focusing the coherent light polarized by the $\lambda/2$ polarizer 44, an optical waveguide type of wavelength converting device 46 formed of LiTaO$_3$ for converting fundamental waves of the coherent light focused by the focusing lens 45 into second harmonic waves to produce semiconverted light, a second collimator lens 47 for collimating the fundamental waves passing through the wavelength converting device 46, a dichroic mirror 48 for dividing the fundamental waves collimated by the second collimator lens 47 and the second harmonic waves substantially collimated into the fundamental waves and the second harmonic waves, a reflection type of diffraction grating 49 for diffracting the fundamental waves of the coherent light divided in the dichroic mirror 45 and reflecting the fundamental waves diffracted to the same optical path as that of the fundamental waves radiated to the diffraction grating 49 to feed back the fundamental waves to the semiconductor laser 42, and an outer resonance mirror 50 for mounting the diffraction grating 49.

The diffraction grating 49 is inclined at an inclination $\theta$ from an optical axis of the fundamental waves radiated to the diffraction grating 49, and a large number of linear gratings are formed in parallel to each other on the outer resonance mirror 50 to produce the diffraction grating 49. The pitch Dp of the linear gratings is determined to achieve the phase matching of the required mode of coherent light according to Bragg condition.

$$Dp = \lambda_f / (2 * \sin\theta) \tag{1}$$

In the first embodiment, $\lambda_f = 0.86$ μm, Dp=0.86 μm, and $\theta = 30$ degrees are set.

Also, the height of the linear gratings formed on the mirror 50 is adjusted to mainly diffract and reflect first-order diffraction light of the fundamental waves, and the inclination $\theta$ is adjusted in advance to diffract and reflect the required mode of coherent light to the same optical path as that of the required mode of coherent light radiated to the diffraction grating 49.

A 2%-reflection coat is applied on a first end face 42a of the semiconductor laser 42 facing the collimator lens 43, and a 100%-reflection coat is applied on a second end face 42b of the semiconductor laser 42. In addition, an anti-reflection coat is applied on an inlet end face 46a and an outlet end face 46b of the wavelength converting device 46.

The optical waveguide type of wavelength converting device 46 is manufactured by exchanging Li+ ions of a LiTaO$_3$ substrate for H+ ions of pyrophosphoric acid according to an instantaneous thermal processing.

A method for manufacturing the device 46 is described in detail with reference to FIGS. 5A to 5D, and FIG. 6.

FIG. 5A to 5D are respectively a sectional view of a LiTaO$_3$ substrate, showing a method for manufacturing the optical waveguide type of wavelength converting device 46. FIG. 6 is a diagonal perspective view of the optical waveguide type of wavelength converting device 46 shown in FIG. 4.

Figure 5A:
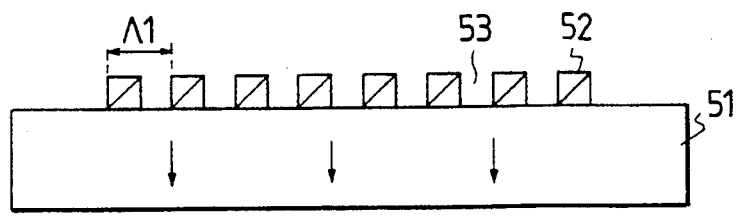
FIGS. 5A to 5D are respectively a cross-sectional view of a LiTaO$_3$ substrate, showing a method for manufacturing an optical waveguide type of wavelength converting device shown in FIG. 4.
Figure 6:
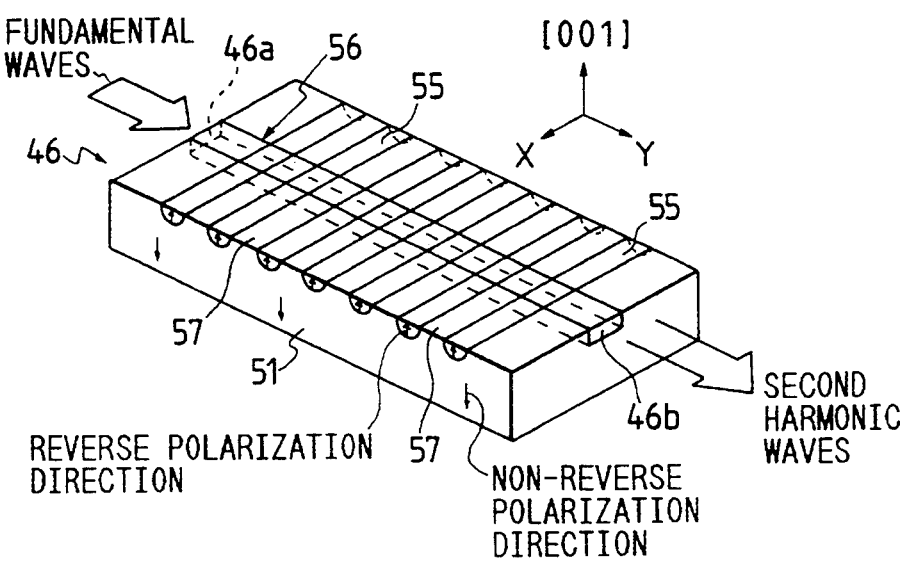
FIG. 6 is a diagonal perspective view of the optical waveguide type of wavelength converting device produced according to the method shown in FIGS. 5A, 5D.

As shown in FIG. 5A, a LiTaO$_3$ substrate 51 having an upper surface defined as (001)-plane in the Miller indices is prepared. The LiTaO$_3$ substrate 51 is polarized in a lower direction. Thereafter, Ta is deposited over the entire LiTaO$_3$ substrate 51 before the Ta deposited is periodically etched according to a photolithography process and a dry etching process to form a patterned Ta film 52 on the LiTaO$_3$ substrate 51. In this case, a plurality of rectangular openings 53 are periodically formed at a pitch $\Lambda$1 on the LiTaO$_3$ substrate 51.

Figure 5B:
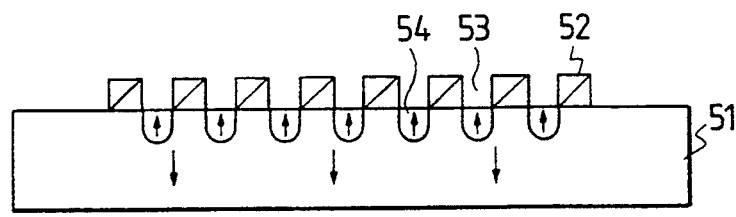

Thereafter, as shown in FIG. 5B, the LiTaO$_3$ substrate 51 is immersed in a pyrophosphoric acid (H$_4$P$_2$O$_7$) solution for thirty minutes at a temperature of 260° C. to periodically form a plurality of first proton exchange layers 54 in the LiTaO$_3$ substrate 51 exposed to the openings 53 according to a first proton exchange process. In detail, a part of Li+ ions of the LiTaO$_3$ substrate 51 are exchanged for H+ ions of the pyrophosphoric acid solution according to the first proton exchange process so that the first proton exchange layers 54 made of LiTaO$_3$ and LiHTaO$_3$ are periodically formed. The depth of the first proton exchange layers 54 is 0.8 μm. In this case, because Li density included in the first proton exchange layers 54 is reduced, Curie temperature of the first proton exchange layers 54 is lowered. For example, because the Curie temperature of LiTaO$_3$ is 620° C., the dielectric polarization of the first proton exchange layers 54 can be easily reversed at a low temperature such as 590° C.

Figure 5C:
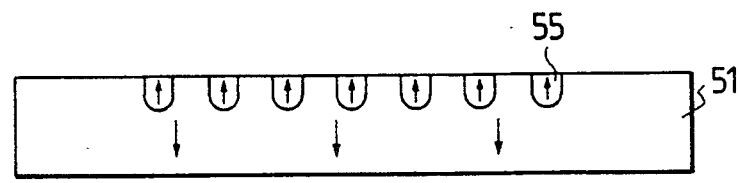

Thereafter, temperature of the first proton exchange layers 54 in the LiTaO$_3$ substrate 51 rises at a rate of 1° C. per a second, and the first proton exchange layers 54 are heated for ten minutes at a temperature of 590° C. Thereafter, the temperature of the first proton exchange layers 54 is reduced at a rate of 50° C. per a minute. Therefore, the dielectric polarization of the first proton exchange layers 54 is reversed from the lower direction to an upper direction. The first proton exchange layers 54 of which the dielectric polarization is reversed are called reverse polarization layers 55. Thereafter, the LiTaO₃ substrate 51 is immersed in a mixed solution of HF and HNF₃ (HF:HNF₃=1:1) for two minutes to take off the Ta film 52, as shown in FIG. 5C.

Figure 5D:
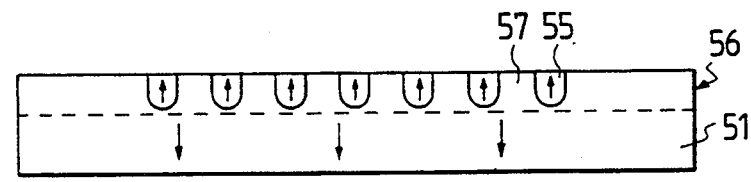

Thereafter, the reverse polarization layers 55 and the LiTaO₃ substrate 51 are deposited by a Ta film (not shown) to protect Li⁺ ions of the reverse polarization layers 55 from being exchanged for H⁺ ions according to a second proton exchange process. The Ta film has a slit of which a width is 4 μm and a length is 12 mm. Thereafter, the LiTaO₃ substrate 51 with the reverse polarization layers 55 is immersed in the pyrophosphoric acid solution for sixteen minutes at a temperature of 260° C. according to the second proton exchange process to change the LiTaO₃ substrate 51 and the reverse polarization layers 55 not deposited by the Ta film to a high refractive index layer of which the thickness is 1.0 μm. Thereafter, the Ta film is taken off, and the high refractive index layer are annealed for ten minutes at a temperature of 380° C. As a result, as shown in FIGS. 5D, 6, the high refractive index layer is changed to an optical waveguide 56 which is composed of alternate rows of the reverse polarization layers 55 and non-reverse polarization layers 57. The optical waveguide 56 is obtained by increasing the refractive index of the substrate 51 by 0.02. The regular intervals Λ1 of the alternate rows are 3.8 μm.

The method for manufacturing the reverse polarization layers 55 is not limited to the first proton exchange process. That is, it is preferred that the reverse polarization layers 55 be produced by injecting an ion beam or a focused ion beam to the substrate 51.

In the above configuration of the shorter wavelength light generating apparatus 41, various modes of coherent light including a required mode of coherent light are initially generated in and radiated from the semiconductor laser 42. Each of the various modes of coherent light has a wavelength. The various modes of coherent light radiated from the semiconductor laser 42 are collimated by the first collimator lens 43. Thereafter, the various modes of coherent light collimated is rotatively polarized by 90 degrees in the λ/2 polarizer 44, and the various modes of coherent light polarized are focused on the optical waveguide 56 of the wavelength converting device 46 by the focusing lens 45. In this case, because the sectional size of the optical waveguide 56 having the width of 4 μm and the depth of 0.5 μm is small, the various modes of coherent light polarized is required to be strictly focused. Thereafter, the various modes of coherent light pass through the optical waveguide 56 of the wavelength converting device 46. Thereafter, the various modes of coherent light are radiated from the outlet end face 46b of the wavelength converting device 46 while spreading out in conical shape. Thereafter, the various modes of coherent light are collimated by the second collimator lens 47 and pass through the dichroic mirror 48.

Thereafter, the various modes of coherent light are radiated to the diffraction grating 49. In the diffraction grating 49, the various modes of coherent light are diffracted at various angles of diffraction in dependence on the wavelengths of the various modes of coherent light. Specifically, the required mode of coherent light is diffracted at a feedback angle of diffraction and is reflected to the same optical path as that of the various modes of coherent light radiated to the diffraction grating 49. Thereafter, first-order diffraction light obtained by diffracting the required mode of coherent light is fed back to the first end face 42a of the semiconductor laser 42 after the first-order diffraction light passes through the dichroic mirror 48, the second collimator lens 47, the wavelength converting device 46, the focusing lens 45, the λ/2 polarizer 44, and the first collimator lens 43 in that order. Therefore, because the 2%-reflection coat is applied on the first end face 42a of the semiconductor laser 42, the first-order diffraction light is coupled in an active layer of the semiconductor laser 42. The intensity of the first-order diffraction light coupled is over 5% of that of the coherent light radiated from the semiconductor laser 42.

In contrast, the other various modes of coherent light are not fed back to the active layer of the semiconductor laser 42 because the wavelength of the required mode of coherent light differs from those of the other various modes of coherent light. As a result, even though approximately 1% of the coherent light focused on the input end face 46a of the device 46 is reflected and fed back to the semiconductor laser 42, the required mode of-coherent light is dominantly induced by the first-order diffraction light coupled in the semiconductor laser 42 because the first-order diffraction light coupled overcomes the coherent light which is focused on the input end face 46a of the device 46 and is reflected to the semiconductor laser 42.

Accordingly, even though the various modes of coherent light are initially induced in the semiconductor laser 42, the required mode of coherent light is dominantly generated after a short time in the semiconductor laser 42.

Thereafter, the required mode of coherent light dominantly generated in the semiconductor laser 42 is radiated to the wavelength converting device 46 after the required mode of coherent light passes through the first collimator lens 43, the λ/2 polarizer 44 and the focusing lens 45 in that order. In the wavelength converting device 46, a part of fundamental waves in the required mode of coherent light having the wavelength 860 nm (0.86 μm) are converted into second harmonic waves having the wavelength 430 nm according to the quasi-phase matching because the wavelength of the fundamental waves optically agrees with the regular intervals Λ1 (Λ1=3.8 μm) of the alternate rows. Therefore, semiconverted light composed of both the second harmonic waves and the fundamental waves not converted is generated in the device 46. In detail, a part of fundamental waves are initially converted into the second harmonic waves in a reverse polarization layer 55 of the optical waveguide 56, and the phase of the second harmonic waves is inverted while the second harmonic waves pass through the reverse polarization layer 55. Thereafter, the second harmonic waves of which the phase is inverted pass through a non-reverse polarization layer 57 adjacent to the reverse polarization layer 55. In this case, because the polarization direction of the non-reverse polarization layer 57 is opposite to the reverse polarization layer 55, the second harmonic waves passing through the non-reverse polarization layer 57 are amplified without attenuating the second harmonic waves. Therefore, a part of the fundamental waves are gradually converted into the second harmonic waves in the alternate rows of the reverse and non-reverse polarization layers 55, 57.

Thereafter, the semiconverted light is radiated from the outlet end face 46b of the wavelength converting device 46 while the semiconverted light spreads out.

Thereafter, the fundamental waves of the semiconverted light is selectively collimated by the second collimator lens 47, and the fundamental waves collimated and the second harmonic waves in the semiconverted light is divided into the second harmonic waves and the fundamental waves in the dichroic mirror 48. The second harmonic waves divided are output as shorter wavelength light such as blue light. The pumping power of the shorter wavelength light output from the shorter wavelength light generating apparatus 41 is 3 mW.

The fundamental waves divided in the dichroic mirror 48 are radiated to the diffraction grating 49. Therefore, the fundamental waves are diffracted by the diffraction grating 49, and first-order diffraction light of the fundamental waves is reflected to the same optical path as that of the fundamental waves radiated to the diffraction grating 49. In contrast, though zero-order diffraction light of the fundamental waves diffracted by the diffraction grating 49 exists a little, the zero-order diffraction light reflected is lost. Thereafter, the fundamental waves diffracted pass through the dichroic mirror 48 and the second collimator lens 47, and the fundamental waves diffracted are focused on the optical waveguide 56 at the outlet end face 46b of the wavelength converting device 46. Thereafter, a part of the fundamental waves are again converted into the second harmonic waves in the wavelength converting device 46, and semiconverted light composed of the fundamental waves and the second harmonic waves is radiated from the inlet end face 46a of the wavelength converting device 46. The semiconverted light radiated pass through the focusing lens 45, the λ/2 polarizer 44, and the first collimator lens 43. Thereafter, the semiconverted light is fed back to the first end face 42a of the semiconductor laser 42. Therefore, the required mode of coherent light is induced in the semiconductor laser 42 in the same manner. As a result, the wavelength of the coherent light radiated from the semiconductor laser 42 is stabilized to $\lambda_f = 860$ nm.

Accordingly, because the fundamental waves having the wavelength of $\lambda_f = 860$ nm selectively diffracted and reflected by the diffraction grating 49 are fed back to the semiconductor laser 42, the required mode of coherent light can be stably radiated from the semiconductor laser 42. In other words, the wavelength of the coherent light radiated from the semiconductor laser 42 is not fluctuated.

Figure 7:
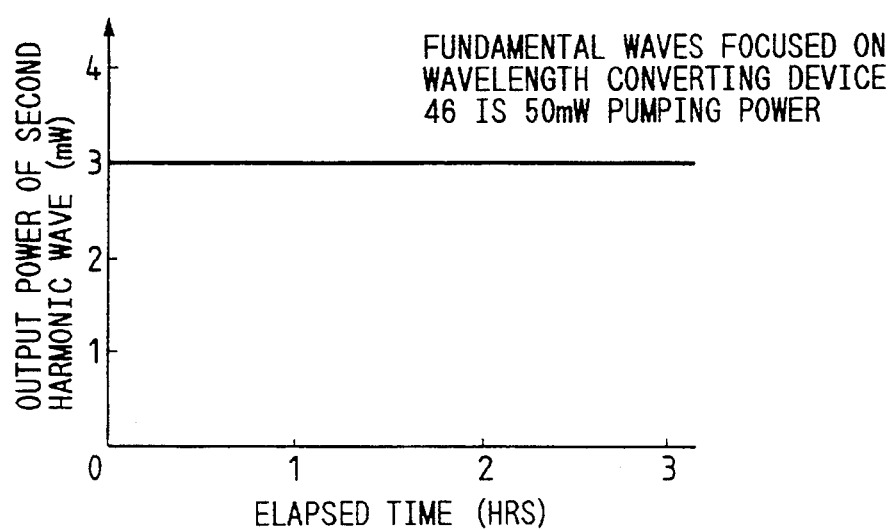
FIG. 7 graphically shows relationship between output power of a second harmonic wave and elapsed time.

FIG. 7 graphically shows relationship between output power of the second harmonic waves and elapsed time.

As shown in FIG. 7, when the fundamental waves having the pumping power of 50 mW are focused on the optical waveguide 56 of the wavelength converting device 46, the second harmonic waves having the pumping power 3 mW can be stably output for a long time because the wavelength of the coherent light radiated from the semiconductor laser 42 is stabilized to 860 nm.

Also, because the second harmonic waves are divided from the semiconverted light composed of the fundamental waves and the second harmonic waves in the dichroic mirror 45, the second harmonic waves can be efficiently obtained as shorter wavelength light.

Also, because the fundamental waves not converted into the second harmonic waves in the wavelength converting device 46 are fed back to the semiconductor laser 42, the fundamental waves can be efficiently converted into the second harmonic waves. Therefore, the second harmonic waves can be efficiently obtained as shorter wavelength light.

In the first embodiment, the 2%-reflection coat is applied on the first end face 42a of the semiconductor laser 42 so that the semiconductor laser 42 functions as a resonator. However, it is preferred that an anti-reflection coat be applied on the first end face 42a. In this case, the fundamental waves are amplified between the second end face 42b of the semiconductor laser 42 and the diffraction grating 49.

Next, a first modification of the first embodiment is described.

Figure 8:
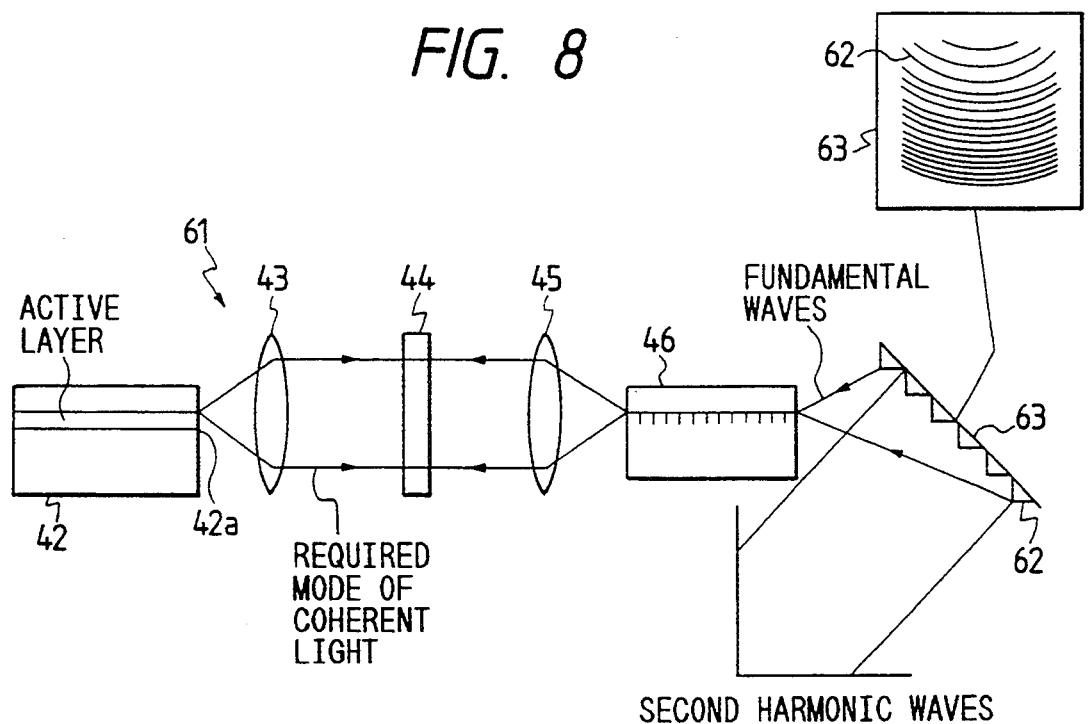
FIG. 8 schematically shows the configuration of a shorter wavelength height generating apparatus according to a first modification of the first embodiment.

FIG. 8 schematically shows the configuration of a shorter wavelength light generating apparatus according to a first modification of the first embodiment.

As shown in FIG. 8, a shorter wavelength light generating apparatus 61 comprises the AlGaAs semiconductor laser 42, the first collimator lens 43, the λ/2 polarizer 44, the focusing lens 45, the optical waveguide type of wavelength converting device 46, and a reflection type of diffraction grating 62 for diffracting the coherent light which is converted by the wavelength converting device 44 and spreads out in conical shape. The diffraction grating 62 is produced by concentrically forming a large number of circular gratings on an outer resonance mirror 63.

In the above configuration, various modes of coherent light including a required mode of coherent light are initially radiated from the semiconductor laser 42 to the diffraction grating 62, and first-order diffraction light in the required mode of coherent light diffracted and reflected by the diffraction grating 62 and the outer resonance mirror 63 is selectively fed back to the semiconductor laser 42 in the same manner as in the apparatus 41. Therefore, the required mode of coherent light is dominantly radiated from the semiconductor laser 42 after a short time.

The required mode of coherent light dominantly radiated from the semiconductor laser 42 passes through the first collimator lens 43, the λ/2 polarizer 44, the focusing lens 45, and the wavelength converting device 46 in that order, in the same manner as in the shorter wavelength light generating apparatus 41. Thereafter, the semiconverted light composed of the fundamental waves not converted in the wavelength converting device 46 and the second harmonic waves converted is radiated to the diffraction grating 62 while the semiconverted light spreads out in conical shape, and the semiconverted light is diffracted by the diffraction grating 62.

Figure 9:
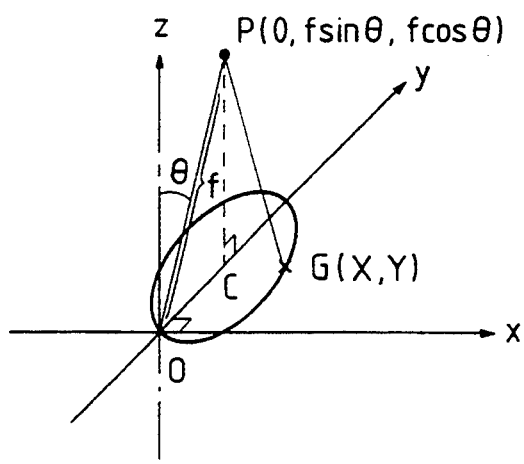
FIG. 9 shows design principle of a diffraction grating shown in FIG. 8.
Figure 9A:
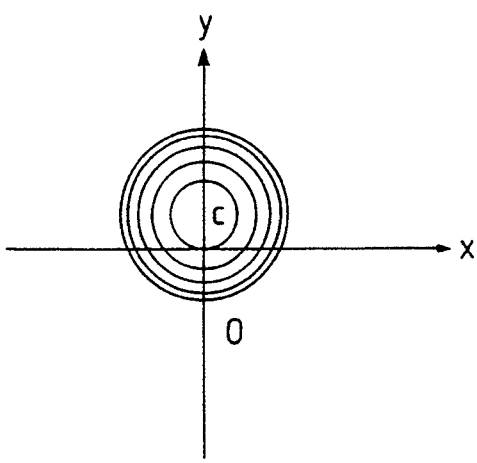

The design principle of the diffraction grating 62 in which the circular gratings are concentrically formed on the outer resonance mirror 63 is described with reference to FIG. 9.

A x, y rectangular co-ordinate system is considered in a plane of the outer resonance mirror 63, and a z co-ordinate axis perpendicular to the x-y plane is considered. In this case, a y co-ordinate axis is set so as to position a divergence/focusing point P of the coherent light radiated from and focused on the outlet end face 46a of the device 46 in a y-z plane. Also, an origin O of a x, y, z space coordinate system is set on the x-y plane for an innermost circular grating formed on the outer resonance mirror 63 to cross the origin O. In addition, the distance PO between the point P and the origin 0 is f, and the angle between a PO line and the y-axis is $\theta$.

In the above conditions, to achieve the phase matching of waves diffracted by the diffraction grating 62 when a moving point of a circular grating is represented by the co-ordinates G (X, Y, O), an equation (2) is required to be satisfied.

$$2 \cdot \overline{PG} = m^* \lambda + 2^* f \quad (m = 0, 1, 2, \ldots) \tag{2}$$

Where PG denotes the distance between the divergence/focusing point P and the moving point G, and the symbol λ denotes the wavelength of the waves diffracted by the diffraction grating 72.

In this case, because the divergence/focusing point P is represented by the co-cordinate P(O, f*sinθ, f*cosθ), an equation (3) is satisfied.

$$\overline{PG}^2 = X^2 + (Y - f^* \sin\theta)^2 + (f^* \cos\theta)^2 \tag{3}$$

To simultaneously satisfy the equations (2) and (3), an equation (4) is required to be satisfied.

$$X^2 + (Y = f^* \sin\theta)^2 = (m^* \lambda/2 + f)^2 - (f^* \cos\theta)^2 \tag{4}$$

The equation (4) is the same as that of a circle with a center C at the co-ordinates (O, f*sinθ, O) and a radius $R(m) = \{(m^*\lambda/2+f)^2 - (f^*\cos\theta)^2\}^{\frac{1}{2}}$.

Accordingly, in cases where circular gratings are concentrically formed on the outer resonance mirror 63 to respectively have a center C(O, f*sinθ, O) and the radius $R(m) = \{(m^*\lambda/2+f)^2 - (f^*\cos\theta)^2\}^{\frac{1}{2}}$ (m=0, 1, 2, ...), the phase matching of waves diffracted by the diffraction grating 62 can be achieved.

After the second harmonic waves are diffracted by the diffraction grating 62, first-order diffraction light of the second harmonic wave diffracted is reflected in a direction perpendicular to the outer resonance mirror 63. In this case, because the first-order diffraction light of the second harmonic waves diffracted is collimated as is well known, the first-order diffraction light of the second harmonic waves diffracted is output as shorter wavelength light such as blue light. Also, after the fundamental waves of the required mode of coherent light are diffracted by the diffraction grating 62, first-order diffraction light of the fundamental waves diffracted is reflected to the same optical path as that of the fundamental waves radiated to the diffraction grating 62 in the same manner as in the shorter wavelength light generating apparatus 41.

As is well known, a ratio of the first-order diffraction light diffracted to zero-order diffraction light diffracted can be easily set by adjusting the height of the circular gratings concentrically formed on the outer resonance mirror 63. Therefore, even though zero-order diffraction light of the second harmonic waves diffracted and zero-order diffraction light of the fundamental waves diffracted are abandoned, energy loss in the shorter wavelength light generating apparatus 61 is small.

Thereafter, the first-order diffraction light of the fundamental waves diffracted passes through the wavelength converting device 46, the focusing lens 45, the λ/2 polarizer 44, and the first collimator lens 43 in that order, in the same manner as in the shorter wavelength light generating apparatus 41. Thereafter, the first-order diffraction light of the fundamental waves fed back to the first end face 42a is coupled in the active layer of the semiconductor laser 42. As a result, the required mode of coherent light is induced in the semiconductor laser 42, and the wavelength of the coherent light radiated from the semiconductor laser 42 is stabilized to 860 nm.

Accordingly, because the second collimator lens 47 or the dichroic mirror 48 is not utilized in the shorter wavelength light generating apparatus 61, the number of constitutional parts can be reduced. Therefore, the shorter wavelength light generating apparatus 61 can be manufactured in a small size.

In the apparatus 61, the first-order diffraction light of the second harmonic waves is output as the shorter wavelength light. However, it is preferred that the zero-order diffraction light of the second harmonic waves be output as the shorter wavelength light.

Next, a shorter wavelength light generating apparatus in which the wavelength of a second harmonic waves output as shorter wavelength light is changeable is described according to a second embodiment.

Figure 10:
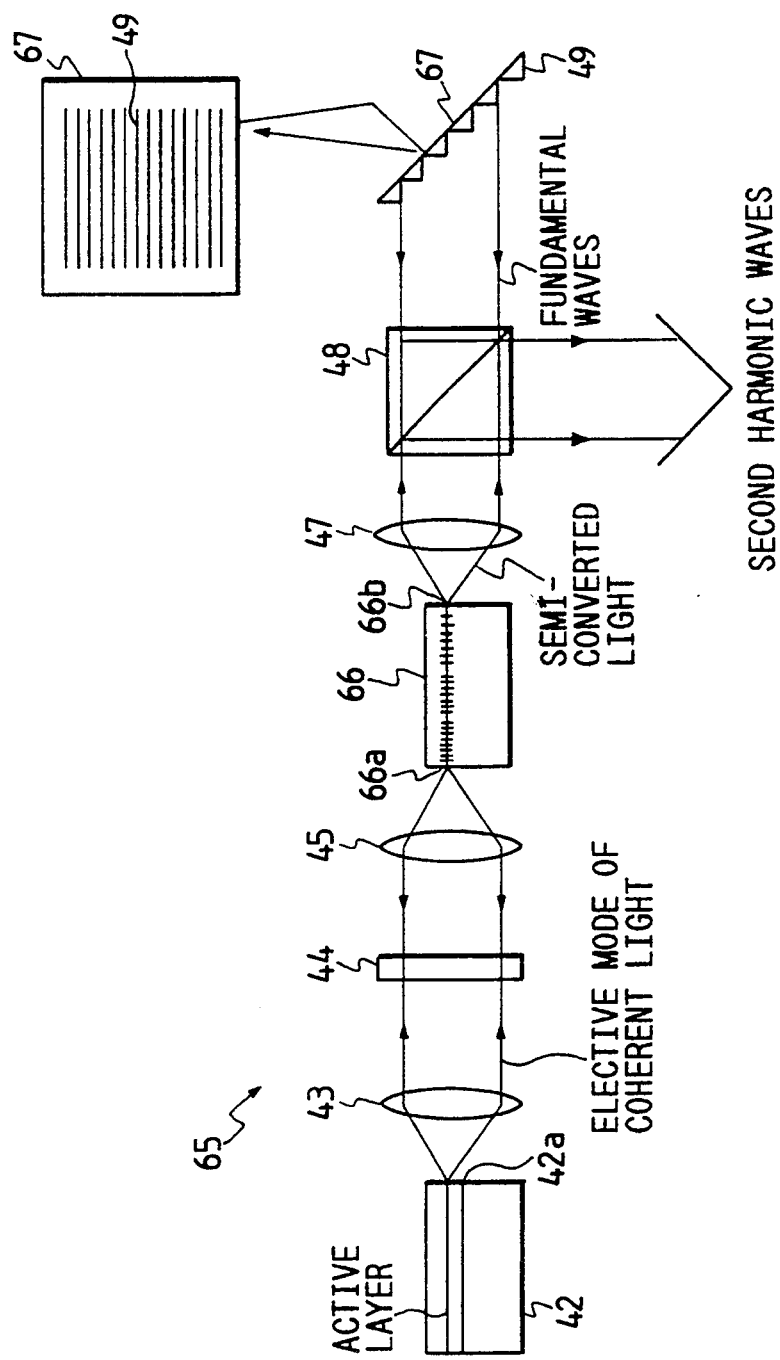
FIG. 10 schematically shows the configuration of a shorter wavelength light generating apparatus according to a second embodiment of the present invention, shorter wavelength light output being changeable in wavelength.

FIG. 10 schematically shows the configuration of a shorter wavelength light generating apparatus according to a second embodiment of the present invention.

As shown in FIG. 10, a shorter wavelength light generating apparatus 65 comprises the semiconductor laser 42 the first collimator lens 43, the λ/2 polarizer 44, the focusing lens 45, an optical waveguide type of wavelength converting device 66 formed of LiTaO₃ for converting fundamental waves of an elective mode of coherent light focused by the focusing lens 45 into second harmonic waves, the second collimator lens 47, the dichroic mirror 48, the diffraction grating 49, and an outer resonance mirror 67 for rotatively mounting the diffraction grating 49.

The outer resonance mirror 67 is changeably inclined at an inclination θ from an optical axis of the fundamental waves, and a large number of linear gratings are formed on the outer resonance mirror 67 to produce the diffraction grating 49 in the same manner as those of the diffraction grating 49. The inclination θ of the outer resonance mirror 67 ranges from 28.5 degrees to 29.5 degrees.

Figure 11:
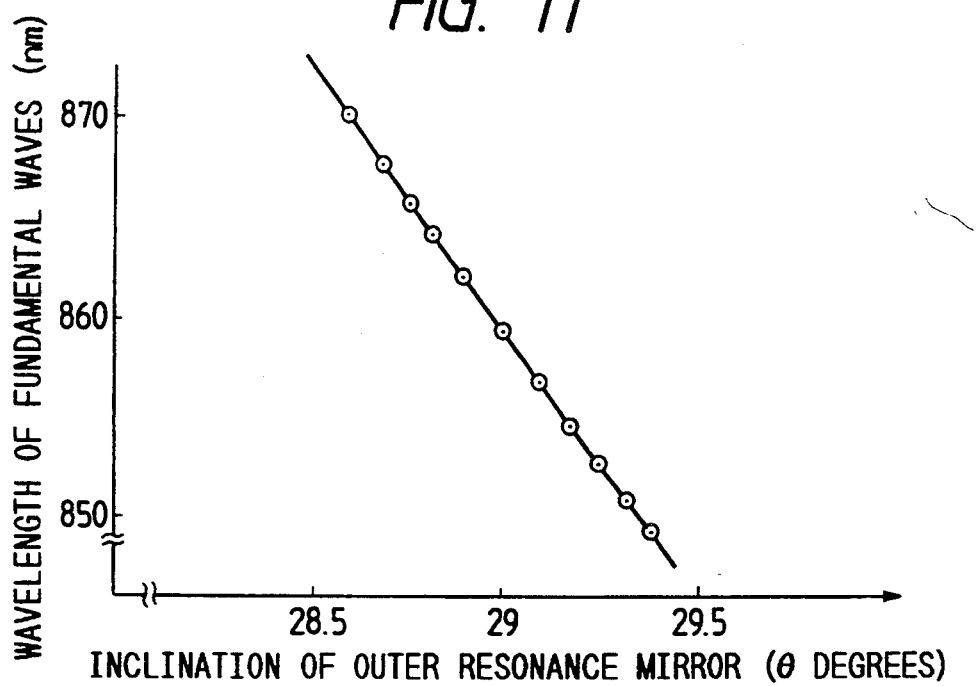
FIG. 11 graphically shows a relationship between the inclination $\theta$ of an outer resonance mirror shown in FIG. 10 and the wavelength of fundamental waves fed back to the same optical path as the fundamental waves radiated to the diffraction grating shown in FIG. 10.

FIG. 11 graphically shows a relationship between the inclination θ of the outer resonance mirror 67 and the wavelength of the fundamental waves fed back to the same optical path as the fundamental waves radiated to the diffraction grating 49.

As shown in FIG. 11, in cases where the fundamental waves are radiated to the diffraction grating 497, the wavelength of the fundamental waves fed back to the same optical path varies in dependence on the inclination θ of the outer resonance mirror 67.

Figure 12A:
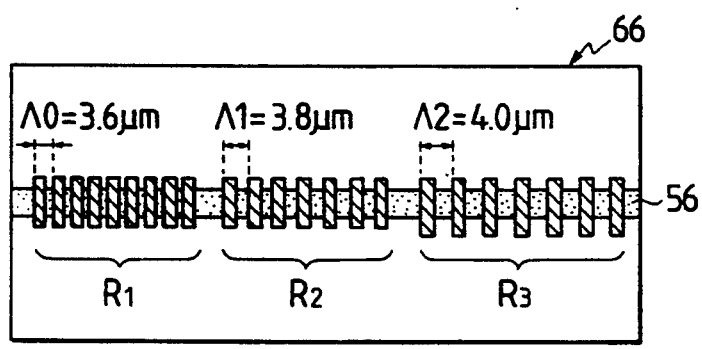
FIG. 12A is a plan view of a wavelength converting device shown in FIG. 10, an optical waveguide of the device being divided into three divisional regions.

The wavelength converting device 66 has three divided regions in the optical waveguide 56, as shown in FIG. 12A. In a first divided region R₁, alternate rows of the reverse polarization layers 55 and the non-reverse polarization layers 57 are arranged at regular intervals of Λ0=3.6 μm. Therefore, in cases where coherent light having a wavelength of 850 nm is radiated to the first divided region R₁ of the optical waveguide 56, a quasi-phase matching condition is satisfied. As a result, a fundamental waves having the wavelength of 850 nm are converted into second harmonic waves having a wavelength of 425 nm. In a second divided region R₂, alternate rows of the reverse polarization layers 55 and non-reverse polarization layers 57 are arranged at regular intervals of Λ1=3.8 μm, in the same manner as in the wavelength converting device 46. Therefore, in cases where coherent light having a wavelength of 860 nm is radiated to the second divided region R₂ of the optical waveguide 56, the quasi-phase matching condition is satisfied. As a result, fundamental waves having the wavelength of 860 nm is converted into second harmonic waves having a wavelength of 430 nm. In a third divided region $R_3$, alternate rows of the reverse polarization layers 55 and non-reverse polarization layers 57 are arranged at regular intervals of $\Lambda2=4.0$ μm. Therefore, in cases where coherent light having a wavelength of 870 nm is radiated to the third divided region $R_3$ of the optical waveguide 56, the quasi-phase matching condition is satisfied. As a result, fundamental waves having the wavelength of 870 nm is converted into second harmonic waves having a wavelength of 435 nm.

In the above configuration, various modes of coherent light are initially radiated from the semiconductor laser 42 to the diffraction grating 49 in the same manner as in the apparatus 41.

In cases where the inclination $\theta$ of the outer resonance mirror 67 is set to 29 degrees, a mode of coherent light radiated to the diffraction grating 49 is diffracted and reflected to the same optical path as that of the various mode of coherent light radiated to the diffraction grating 49 on condition that the wavelength of the mode of coherent light is 860 nm. The mode of coherent light having the wavelength 860 nm is called an elective mode of coherent light. Thereafter, the elective mode of coherent light is fed back to the semiconductor laser 42, and the elective mode of coherent light having the wavelength 860 nm is dominantly radiated from the semiconductor laser 42. As a result, the wavelength of the coherent light radiated from the semiconductor laser 42 is stabilized to 860 nm. Thereafter, fundamental waves of the elective mode of coherent light are converted into second harmonic waves having the wavelength of 430 nm in the second divided region $R_2$ of the wavelength converting device 66. In this case, the fundamental waves pass through the first divided region $R_1$ and the third divided region $R_3$ without being converted into the second harmonic waves. Therefore, the second harmonic waves having the wavelength of 430 nm can be output as shorter wavelength light in the same manner as in the apparatus 41.

In cases where the inclination $\theta$ of the outer resonance mirror 67 is set to 29.35 degrees, a mode of coherent light radiated to the diffraction grating 49 is diffracted and reflected to the same optical path as that of the various mode of coherent light radiated to the diffraction grating 49 on condition that the wavelength of the mode of coherent light is 850 nm. The mode of coherent light having the wavelength 850 nm is called an elective mode of coherent light. Thereafter, the elective mode of coherent light is fed back to the semiconductor laser 42, and the elective mode of coherent light having the wavelength 850 nm is dominantly radiated from the semiconductor laser 42. As a result, the wavelength of the coherent light radiated from the semiconductor laser 42 is stabilized to 850 nm. Thereafter, fundamental waves of the elective mode of coherent light are converted into second harmonic waves having the wavelength of 425 nm in the first divided region $R_1$ of the wavelength converting device 66. In this case, the fundamental waves passe through the second divided region $R_2$ and the third divided region $R_3$ without being converted into the second harmonic waves. Therefore, the second harmonic waves having the wavelength of 425 nm can be output as shorter wavelength light.

In cases where the inclination $\theta$ of the outer resonance mirror 67 is set to 28.6 degrees, a mode of coherent light radiated to the diffraction grating 49 is diffracted and reflected to the same optical path as that of the various mode of coherent light radiated to the diffraction grating 49 on condition that the wavelength of the mode of coherent light is 870 nm. The mode of coherent light having the wavelength 870 nm is called an elective mode of coherent light. Thereafter, the elective mode of coherent light is fed back to the semiconductor laser 42, and the elective mode of coherent light having the wavelength 870 nm is dominantly radiated from the semiconductor laser 42. As a result, the wavelength of the coherent light radiated from the semiconductor laser 42 is stabilized to 870 nm. Thereafter, fundamental waves of the elective mode of coherent light are converted into second harmonic waves having the wavelength of 435 nm in the third divided region $R_3$ of the wavelength converting device 66. In this case, the fundamental waves pass through the first divided region $R_1$ and the second divided region $R_2$ without being converted into the second harmonic waves. Therefore, the second harmonic waves having the wavelength of 435 nm can be output as shorter wavelength light.

Accordingly, the wavelength of the second harmonic waves output as the shorter wavelength light can be discretely changed.

Also, the wavelength of the shorter wavelength light output can be easily changed by adjusting the inclination $\theta$ of the outer resonance mirror 67. In this case, the adjustment of the ambient temperature of the semiconductor laser 42 or the adjustment of the current applied to the semiconductor laser 42 is not required. Therefore, the apparatus 65 can be manufactured in a small size.

In the second embodiment, the wavelength converting device 46 of the apparatus 41 is replaced with the wavelength converting device 66 to manufacture the apparatus 65. However, it is preferred that the wavelength converting device 46 of the apparatus 61 shown in FIG. 8 be replaced with the wavelength converting device 66 to manufacture another apparatus.

Figure 12B:
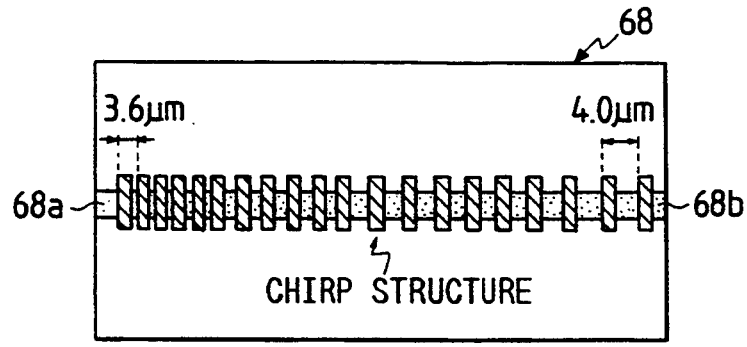
FIG. 12B is a plan view of a wavelength converting device according to another modification of the second embodiment, alternate rows of reverse and non-reverse polarization layers in an optical waveguide of the device being arranged in a chirp structure.

Also, an apparatus in which the wavelength of shorter wavelength light output is changed is not limited to the apparatus 65 in which the wavelength converting device 66 is equipped. That is, it is preferred that the wavelength converting device 46 of the apparatus 41 be replaced with a wavelength converting device 68 shown in FIG. 12B to manufacture the apparatus 65.

The wavelength converting device 68 has the optical waveguide 56 in which the alternate rows of the reverse polarization layers 55 and the non-reverse polarization layers 57 are arranged in a chirp structure to gradually change the regular intervals of tile alternate rows. Specifically, an inlet regular interval of an inlet alternate row adjacent to an inlet end face 68a of the device 68 is 3.6 μm, and an outlet regular interval of an outlet alternate row adjacent to an outlet end face 68b of the device 68 is 4.0 μm.

In the above configuration of the apparatus 65, in cases where the outer resonance mirror 67 is set to the inclination $\theta$ in a range from $\theta=28.5$ degrees to $\theta=29.5$ degrees, the wavelength of the second harmonic waves output from the apparatus 65 as shorter wavelength light can be continuously changed in a range from 425 nm to 435 nm. Accordingly, the tuning of the shorter wavelength light can be easily performed without any tuning circuit.

Also, it is preferred that the wavelength converting device 46 of the apparatus 61 shown in FIG. 8 be replaced with the wavelength converting device 68 to manufacture another apparatus.

Next, a third embodiment of the present invention is described.

FIG. 13 schematically shows the configuration of a shorter wavelength light generating apparatus according to a third embodiment of the present invention, fundamental waves generated in a semiconductor laser being converted into shorter wavelength light such as second harmonic waves in a bulk element type of wavelength converting device of the apparatus.

As shown in FIG. 13, a shorter wavelength light generating apparatus 71 comprises an AlGaAs semiconductor laser 72 for radiating a required mode of coherent light having a wavelength of $\lambda_f = 0.86$ $\mu$m at a pumping power of 100 mW, a collimator lens 73 having a numerical aperture of NA=0.6 for collimating the coherent light radiated from the semiconductor laser 72, a bulk element type of wavelength converting device 74 formed of LiTaO$_3$ for converting a part of fundamental waves of the coherent light collimated by the collimator lens 73 into second harmonic waves to produce semiconverted light, a dichroic mirror 75 for dividing the semiconverted light produced in the wavelength converting device 74 into the fundamental waves and the second harmonic waves, a reflection type of diffraction grating 76 for diffracting the fundamental waves of the coherent light divided in the dichroic mirror 75 and reflecting the fundamental waves diffracted to the same optical path as that of the fundamental waves radiated to the diffraction grating 76, and an outer resonance mirror 77 inclined at an inclination $\theta$ from an optical axis of the fundamental waves.

A 2%-reflection coat is applied on a first end face 72a of the semiconductor laser 72 facing the collimator lens 73, and a 100%-reflection coat is applied on a second end face 72b of the semiconductor laser 72. Therefore, 98% of coherent light amplified in an active layer of the semiconductor laser 72 is radiated from the first end face 72a of the semiconductor laser 72. Also, a large number of linear gratings are formed in parallel to each other on the outer resonance mirror 77 to produce the diffraction grating 76.

Four types of methods for manufacturing the wavelength converting device 74 are described with reference to FIGS. 14A, 14B.

In a first type of method, a ferroelectric LiNbO$_3$ or LiTaO$_3$ substrate is prepared. The substrate prepared is initially polarized in a first direction, as shown in FIG. 14A. Thereafter, a beam of electrons accelerated at an acceleration voltage ranging from 10 keV to 100 keV are deeply injected into parts of the substrate at an electric current intensity ranging from 1 $\mu$A/mm$^2$ to 1000 $\mu$A/mm$^2$ to produce reverse polarization layers 78 polarized in a second direction opposite to the first direction. As a result, as shown in FIG. 14B, alternate rows of the reverse polarization layers 78 polarized in the second direction and non-reverse polarization layers 79 polarized in the first direction are produced at regular intervals $\Lambda 1 = 3.8$ $\mu$m in the substrate.

In a second type of method, a ferroelectric LiNbO$_3$ or LiTaO$_3$ substrate having surfaces defined as (001)-plane in the Miller indices is prepared. The thickness of the substrate prepared is 5 mm, and the substrate prepared is initially polarized in a first direction as shown in FIG. 14A. Thereafter, a metal film is deposited on a surface of the substrate prepared, and the surface of the substrate is grounded. Thereafter, a beam of electrons accelerated at an acceleration voltage of 25 keV is injected into parts of another surface of the substrate to produce reverse polarization layers 78 polarized in a second direction opposite to the first direction. Therefore, the electrons reach the surface of the substrate grounded, and the reverse polarization layers 78 having the thickness of 0.5 mm are produced. As a result, as shown in FIG. 14B, alternate rows of the reverse polarization layers 78 polarized in the second direction and non-reverse polarization layers 79 polarized in the first direction are produced at regular intervals $\Lambda 1 = 3.8$ $\mu$m in the substrate.

In a third type of method, a ferroelectric LiTaO$_3$ substrate having surfaces defined as (001)-plane in the Miller indices is prepared. The substrate is initially polarized in a first direction as shown in FIG. 14A. Thereafter, a focused beam of Si$^{2+}$ ions is injected into parts of the substrate from a surface of the substrate to form reverse polarization layers 78 polarized in a second direction opposite to the first direction. The Si$^{2+}$ ions are accelerated at an acceleration voltage of 200 keV, an electric current intensity of the focused Si$^{2+}$ ions is 120 pA, and a focused diameter of the focused beam is about 1 $\mu$m$\phi$. In this case, the focused beam of Si$^{2+}$ ions is periodically scanned on the surface of the substrate at a scanning speed of 84 $\mu$m/sec to alternatively arrange the reverse polarization layers 78 and non-reverse polarization layers 79. Also, the reverse polarization layers having a layer width of 1.9 $\mu$m ($\Lambda\frac{1}{2} = 1.9$ $\mu$m) reach an opposite surface of the substrate while uniformly maintaining the layer width. As a result, as shown in FIG. 14B, alternate rows of the reverse polarization layers 78 and the non-reverse polarization layers 79 are arranged at a pitch of $\Lambda 1 = 3.8$ $\mu$m, and the depth of the reverse polarization layer is 0.5 mm.

In a fourth type of method, a ferroelectric LiTaO$_3$ substrate having surfaces defined as (001)-plane in the Miller indices is prepared. The substrate is initially polarized in a first direction as shown in FIG. 14A. Thereafter, Ta is deposited on a surface of the substrate, and the surface of the substrate is etched to take off a Ta layer in stripes at regular intervals $\Lambda 1$ according to a photo dry etching. Thereafter, several drops of pyrophosphoric acid (H$_4$P$_2$O$_7$) are put on the strips for thirty minutes at a temperature of 230° C. Therefore, the substrate reacts to the pyrophosphoric acid, and reverse polarization layers 78 polarized in a second direction opposite to the first direction are deeply produced in stripes. As a result, as shown in FIG. 14B, alternate rows of the reverse polarization layers 78 and non-reverse polarization layers 79 are produced at regular intervals $\Lambda 1 = 3.8$ $\mu$m in the substrate.

Thereafter, inlet and outlet end faces 74a, 74b of the device 74 are optically ground. Thereafter, an anti-reflection coat is applied on the inlet end face 74a of the device 74 to receive coherent light having a wavelength of 860 nm radiated to the inlet end face 74a of the device 74 without any reflection. Also, the anti-reflection coat is applied on the outlet end face 74b of the device 74 to radiate the coherent light from the device 74 without any reflection.

In the above configuration of the shorter wavelength light generating apparatus 71, various modes of coherent light including a required mode of coherent light are initially radiated from the semiconductor laser 72 to the diffraction grating 76. Thereafter, first-order diffraction light in the required mode of coherent light diffracted and reflected by the diffraction grating 76 is selectively fed back to the semiconductor laser 72 in the same manner as in the apparatus 41. Therefore, the required mode of coherent light is dominantly radiated from the semiconductor laser 72 after a short time.

The required mode of coherent light dominantly radiated from the semiconductor laser 72 is collimated by the collimator lens 73. Thereafter, the coherent light collimated enters the wavelength converting device 74. In the wavelength converting device 74, a part of the fundamental waves having the wavelength 860 nm are converted into the second harmonic waves having the wavelength 430 nm. In detail, a part of the fundamental waves are initially converted into the second harmonic waves in a reverse polarization layer 78, and the phase of the second harmonic waves is inverted while the second harmonic waves pass through the reverse polarization layer 78. Thereafter, the second harmonic waves of which the phase is inverted pass through a non-reverse polarization layer 79 adjacent to the reverse polarization layer 78. In this case, because the polarization direction of the non-reverse polarization layer 79 is opposite to the reverse polarization layer 78, the second harmonic waves passing through the non-reverse polarization layer 79 are amplified without attenuating the second harmonic waves. Therefore, a part of the fundamental waves are gradually converted into the second harmonic waves in the alternate rows of the reverse and non-reverse polarization layers 78, 79.

Thereafter, semiconverted light composed of the fundamental waves not converted into the second harmonic waves in the wavelength converting device 74 and the second harmonic waves produced in the device 74 is divided by the dichroic mirror 75 into the fundamental waves and the second harmonic waves. Therefore, the second harmonic waves divided are output as shorter wavelength light such as blue light. Also, the fundamental waves divided by the dichroic mirror 75 are radiated to the diffraction grating 76. Thereafter, first-order diffraction light of the fundamental waves diffracted by the diffraction grating 76 is reflected. In this case, the fundamental waves in the required mode of coherent light having the wavelength 860 nm are selectively fed back to the same optical path as that of the fundamental waves radiated to the diffraction grating 76 because a feed back direction of the fundamental waves depends on the inclination $\theta$ of the diffraction grating 76, a pitch Dp of linear gratings formed on the outer resonance mirror 77, and the wavelength $\lambda_f$ of the fundamental waves, as formulated by the equation (1). A diffraction efficiency in the diffraction grating 76 is over 90%.

Thereafter, the fundamental waves diffracted pass through the dichroic mirror 75, the wavelength converting device 74, and the collimator lens 73 in that order, and the fundamental waves are radiated to the first end face 72a of the semiconductor laser 72. In this case, because the 2%-reflection coat is applied on the first end face 72a, the fundamental waves radiated to the first end face 72a are coupled in the active layer of the semiconductor laser 72, and the required mode of coherent light is induced in the semiconductor laser 72. In other words, the required mode of coherent light is amplified between the first and second end faces 72a, 72b of the semiconductor laser 72. As a result, the wavelength of the coherent light radiated from the semiconductor laser 72 is stabilized to 860 nm.

Accordingly, because the bulk element type of wavelength converting device 74 is utilized to convert the fundamental waves into the second harmonic waves, the optical path in the device 74 is not limited to any optical waveguide. Therefore, any focusing lens is not required to strictly focus the coherent light on a spot of the device 74. Also, any collimating lens is not required to collimate the semiconverted light radiated from the device 44. In contrast, the focusing lens 45 is required to focus the coherent light on the optical waveguide 56 of the device 46 in the apparatus 41, and the second collimating lens 47 is required to collimate the semiconverted light radiated from the optical waveguide 56 of the device 46 in the apparatus 41. As a result, the apparatus 71 can be manufactures in a small size as compared with the apparatus 41.

Also, when the coherent light passes through the wavelength converting device 74, a cross-sectional area of the coherent light is larger than that of the coherent light passing through the optical waveguide 56 of the device 46 in the apparatus 41. Accordingly, even though the pumping power of the coherent light radiated from the semiconductor laser 72 is large, the pumping power density of the coherent light can be reduced in the device 74. Therefore, the fundamental waves of the coherent light can be inverted into the second harmonic waves without optically damaging the wavelength converting device 74.

Also, because the pumping power of the coherent light radiated from the semiconductor laser 72 can be large, the pumping power of the shorter wavelength light can be large.

Also, because the fundamental waves selectively diffracted and reflected by the diffraction grating 76 are fed back to the semiconductor laser 72, the required mode of coherent light can be stably radiated from the semiconductor laser 72. In other words, the wavelength of the coherent light radiated from the semiconductor laser 72 is not fluctuated.

Also, because the second harmonic waves are divided from the semiconverted light composed of the fundamental waves and the second harmonic waves in the dichroic mirror 75, the second harmonic waves can be efficiently obtained as shorter wavelength light.

Also, because the fundamental waves not converted into the second harmonic waves in the wavelength converting device 74 are fed back to the semiconductor laser 72, the fundamental waves can be efficiently converted into the second harmonic waves. Therefore, the second harmonic waves can be efficiently obtained as shorter wavelength light.

In the third embodiment, the 2%-reflection coat is applied on the first end face 72a so that the semiconductor laser 72 functions as a resonator. However, it is preferred that an anti-reflection coat be applied on the first end face 72a. In this case, the fundamental waves are amplified between the second end face 72b of the semiconductor laser 72 and the diffraction grating 76.

Next, a first modification of the third embodiment is described.

Figure 15:
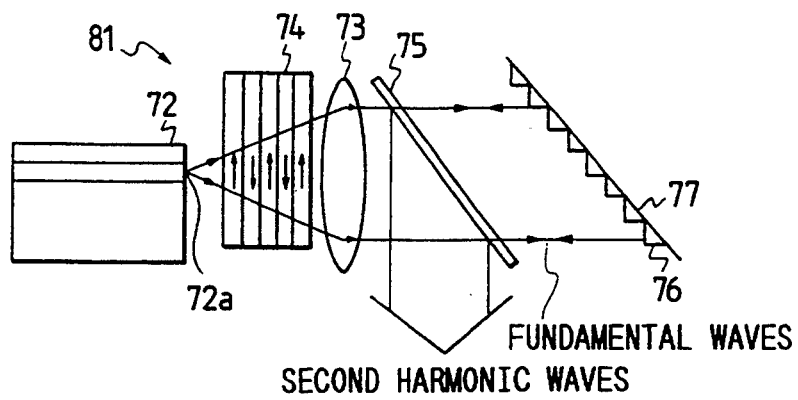
FIG. 15 schematically shows the configuration of a shorter wavelength light generating apparatus according to a first modification of the third embodiment.

FIG. 15 schematically shows the configuration of a shorter wavelength light generating apparatus according to a first modification of the third embodiment.

As shown in FIG. 15, the wavelength converting device 74 is arranged between the collimator lens 73 and the semiconductor laser 72 in a shorter wavelength light generating apparatus 81. That is, the distance between the semiconductor laser 72 and the wavelength converting device 74 is reduced, so that a radiation diameter of the coherent light converted in the wavelength converting device 74 is reduced. Therefore, a pumping power density of the coherent light is increased in the wavelength converting device 74. As a result, a part of the fundamental waves of the coherent light can be converted into the second harmonic waves at a high probability.

Accordingly, the second harmonic waves can be efficiently output as shorter wavelength light in the apparatus 81 as compared with the apparatus 71.

The dichroic mirror 75 is not necessarily required in the shorter wavelength light generating apparatus 71.

Figure 16:
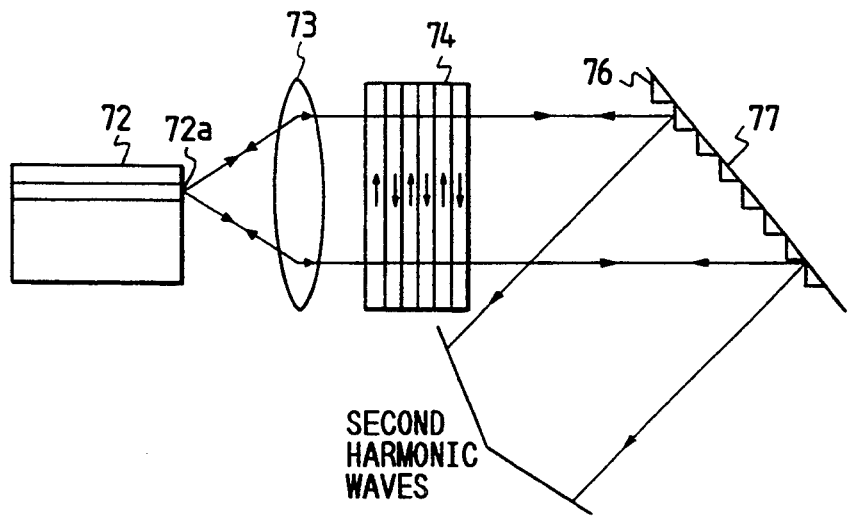
FIG. 16 schematically shows the configuration of a shorter wavelength light generating apparatus according to a second modification of the third embodiment.

FIG. 16 schematically shows the configuration of a shorter wavelength light generating apparatus according to a second modification of the third embodiment.

As shown in FIG. 16, a shorter wavelength light generating apparatus 82 comprises the semiconductor laser 72, the collimator lens 73, the wavelength converting device 74, the outer resonance mirror 77, and the diffraction grating 76.

In the above configuration, the semiconverted light produced in the wavelength converting device 74 is radiated to the diffraction grating 76 without dividing the semiconverted light into the fundamental waves and the second harmonic waves. Thereafter, zero-order diffraction light of the second harmonic waves diffracted by the diffraction grating 76 are reflected and are output as shorter wavelength light. Also, first-order diffraction light of the fundamental waves diffracted by the diffraction grating 76 is fed back to the same optical path as that of the semiconverted light radiated to the diffraction grating 76. In contrast, first-order diffraction light of the second harmonic waves diffracted and zero-order diffraction light of the fundamental waves diffracted are abandoned.

Accordingly, because any dichroic mirror is not equipped in the shorter wavelength light generating apparatus 82, the apparatus can be manufactured in a small size as compared with the shorter wavelength light generating apparatus 71.

In addition, the collimator lens 73 is not necessarily required in the shorter wavelength light generating apparatus 71.

Figure 17:
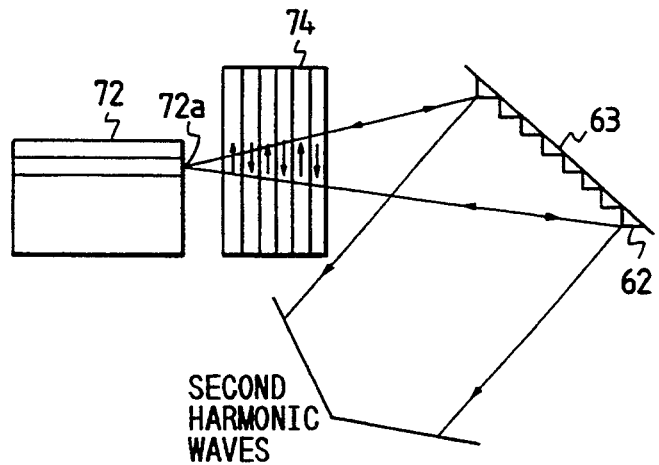
FIG. 17 schematically shows the configuration of a shorter wavelength light generating apparatus according to a third modification of the third embodiment.

FIG. 17 schematically shows the configuration of a shorter wavelength light generating apparatus according to a third modification of the third embodiment.

As shown in FIG. 17, a shorter wavelength light generating apparatus 83 comprises the semiconductor laser 72, the wavelength converting device 74, the outer resonance mirror 63, and the diffraction grating 62.

In the above configuration, the fundamental waves of the coherent light radiated from the semiconductor laser 72 are converted into the second harmonic waves in the wavelength converting device 74 while the coherent light spreads out. Thereafter, the fundamental waves not converted in the device 4 and the second harmonic waves converted are radiated to the diffraction grating 62 while the waves spread out in conical shape. In the diffraction grating 62, because the circular gratings are concentrically formed on the outer resonance mirror 63, first-order diffraction light of the fundamental waves diffracted is fed back to the same optical path as that of the fundamental waves radiated to the diffraction grating 62, and the first-order diffraction light of the fundamental waves diffracted is focused on the first end face 72a of the semiconductor laser 72. Also, first-order diffraction light of the second harmonic waves diffracted is collimated and reflected to an output optical path different from that of the fundamental waves because the wavelength of the second harmonic waves differs from that of the fundamental waves. Therefore, the first-order diffraction light of the second harmonic waves diffracted is output as shorter wavelength light.

In this case, it is preferred that zero-order diffraction light of the second harmonic waves diffracted be output as shorter wavelength light in place of the first-order diffraction flight of the second harmonic waves diffracted.

Accordingly, because neither a collimator lens nor a dichroic mirror is equipped in the shorter wavelength light generating apparatus 83, the number of constitutional parts can be reduced. Therefore, the shorter wavelength light generating apparatus 83 can be manufactured in a small size.

Next, a shorter wavelength light generating apparatus in which the wavelength of second harmonic waves output as shorter wavelength light is changeable is described according to a fourth embodiment of the present invention.

Figure 18:
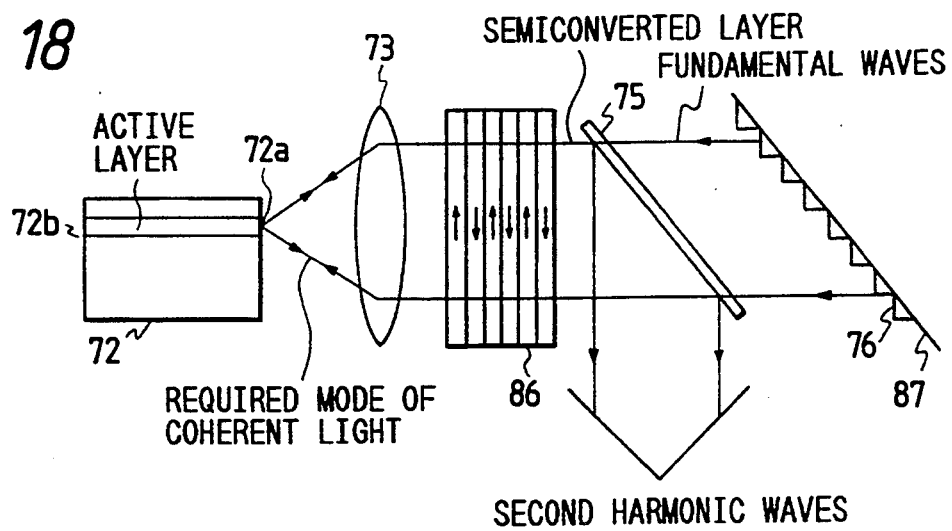
FIG. 18 schematically shows the configuration of a shorter wavelength light generating apparatus according to a fourth embodiment of the present invention.

FIG. 18 schematically shows the configuration of a shorter wavelength light generating apparatus according to a fourth embodiment of the present invention.

As shown in FIG. 18, a shorter wavelength light generating apparatus 85 comprises the semiconductor laser 72 the collimator lens 73, a bulk element type of wavelength converting device 86 formed of $LiTaO_3$ for converting fundamental waves of the coherent light collimated by the collimator lens 73 into second harmonic waves, the dichroic mirror 75, the diffraction grating 76, and an outer resonance mirror 87 for rotatively mounting the diffraction grating 76.

The outer resonance mirror 87 is changeably inclined at an inclination $\theta$ from an optical axis of the fundamental waves, and a large number of linear gratings are formed on the outer resonance mirror 87 to produce the diffraction grating 76 in the same manner as those of the diffraction grating 76. The outer resonance mirror 67 functions in the same manner as the mirror 67.

Figure 19A:
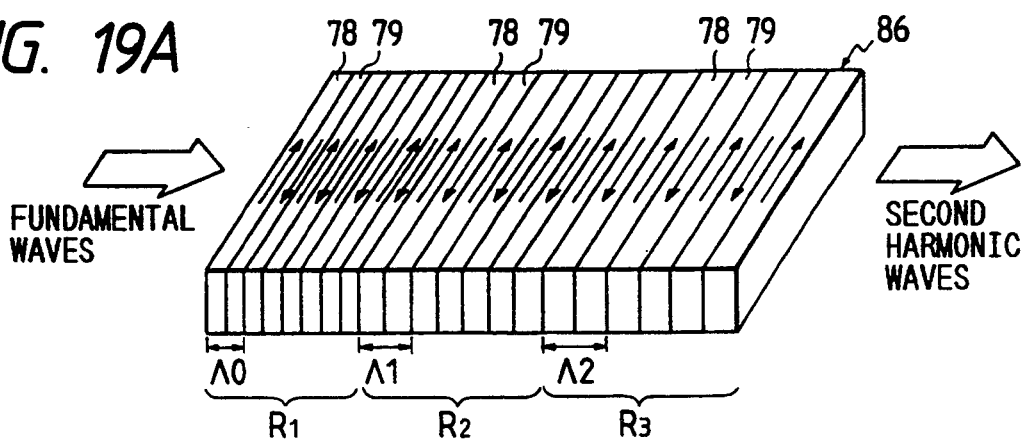
FIG. 19A is a diagonal view of a wavelength converting device shown in FIG. 18, alternate rows of reverse and non-reverse polarization layers being divided into three divisional regions.

The wavelength converting device 86 has three divided regions, as shown in FIG. 19A. In a first divided region $R_1$, alternate rows of the reverse polarization layers 78 and the non-reverse polarization layers 79 are arranged at regular intervals of $\Lambda 0 = 3.6$ μm. Therefore, in cases where coherent light having a wavelength of 850 nm is radiated to the first divided region $R_1$, a quasi-phase matching condition is satisfied. In a second divided region $R_2$, alternate rows of the reverse polarization layers 78 and non-reverse polarization layers 79 are arranged at regular intervals of $\Lambda 1 = 3.8$ μm, in the same manner as in the wavelength converting device 74. Therefore, in cases where coherent light having a wavelength of 860 nm is radiated to the second divided region $R_2$ of the optical waveguide 56, the quasi-phase matching condition is satisfied. In a third divided region $R_3$, alternate rows of the reverse polarization layers 78 and non-reverse polarization layers 79 are arranged at regular intervals of $\Lambda 1 = 4.0$ μm. Therefore, in cases where coherent light having a wavelength of 870 nm is radiated to the third divided region $R_3$ of the optical waveguide 56, the quasi-phase matching condition is satisfied.

In the above configuration, various modes of coherent light are initially radiated from the semiconductor laser 72 to the diffraction grating 76 in the same manner as in the apparatus 71.

In cases where the inclination $\theta$ of the diffraction grating 67 is set to $\theta_1=29.35°$, $\theta_2=29°$, or $\theta_3=28.6°$, a mode of coherent light radiated to the diffraction grating 76 is diffracted and reflected to the same optical path as that of the various mode of coherent light radiated to the diffraction grating 76 on condition that the wavelength of the mode of coherent light is $\lambda_f=850$ nm ($\theta_1=29.35°$), 860 nm ($\theta_2=29°$), or 870 nm ($\theta_3=28.6°$). The mode of coherent light having the wavelength $\lambda_f$ is called an elective mode of coherent light. Thereafter, the elective mode of coherent light is fed back to the semiconductor laser 72, and the elective mode of coherent light having the wavelength $\lambda_f$ is dominantly radiated from the semiconductor laser 72. As a result, the coherent light radiated from the semiconductor laser 72 is stabilized to the wavelength $\lambda_f$. Thereafter, fundamental waves of the coherent light are converted into second harmonic waves having the wavelength $\lambda_f/2$ in the first divided region $R_1$ ($\theta_1=29.35°$), the second divided region $R_2$ ($\theta_2=29°$), the third divided region $R_3$ ($\theta_3=28.6°$). Therefore, the second harmonic waves having the wavelength $\lambda_f/2$ can be output as shorter wavelength light in the same manner as in the apparatus 71.

Accordingly, the wavelength of the second harmonic waves output as shorter wavelength light can be discretely changed.

Also, the wavelength of the shorter wavelength light output can be easily changed by adjusting the inclination $\theta$ of the outer resonance mirror 87. In this case, the adjustment of the ambient temperature of the semiconductor laser 72 or the adjustment of the current applied to the semiconductor laser 72 is not required. Therefore, the apparatus 85 can be manufactured in a small size.

In the fourth embodiment, the wavelength converting device 74 of the apparatus 71 is replaced with the wavelength converting device 86 to manufacture the apparatus 85. However, it is preferred that the wavelength converting device 74 of the apparatus 81, 82, or 83 shown in FIG. 15, 16, or 17 be replaced with the wavelength converting device 86 to manufacture another apparatus.

Figure 19B:
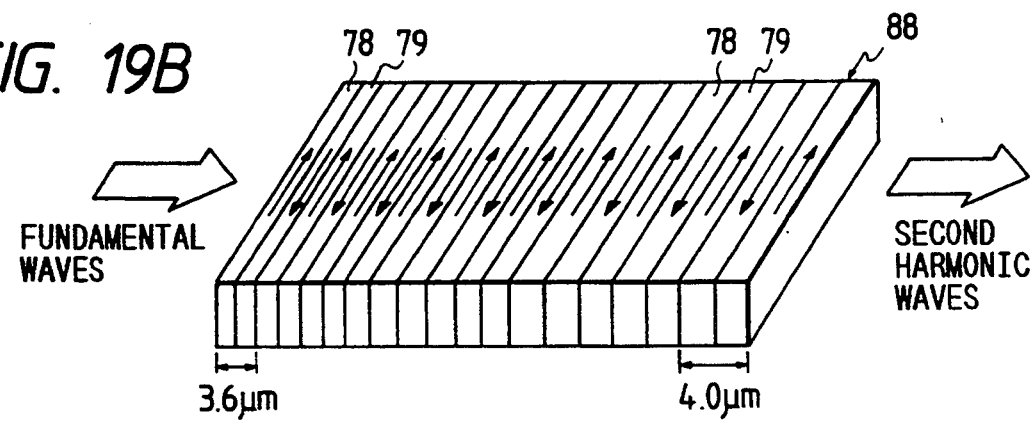
FIG. 19B is a diagonal view of a wavelength converting device according to another modification of the fourth embodiment, alternate rows of reverse and non-reverse polarization layers being arranged in a chirp structure.

Also, an apparatus in which the wavelength of shorter wavelength light output is changed is not limited to the apparatus 85 in which the wavelength converting device 86 is equipped. That is, it is preferred that the wavelength converting device 74 of the apparatus 71 be replaced with a wavelength converting device 88 shown in FIG. 19B to manufacture the apparatus 85.

In the wavelength converting device 88, the alternate rows of the reverse polarization layers 78 and the non-reverse polarization layers 79 are arranged in a chirp structure to gradually change regular intervals $\Lambda0$, $\Lambda1$, $\Lambda2$ of the alternate rows. An inlet interval of an inlet alternate row adjacent to an inlet end face of the device 88 is 3.6 μm, and an outlet interval of an outlet alternate row adjacent to an outlet end face of the device 88 is 4.0 μm.

In the above configuration of the apparatus 85, in cases where the diffraction grating 67 is set to the inclination $\theta$ in a range from $\theta=28.5$ degrees to $\theta=29.5$ degrees, the wavelength of the second harmonic waves output from the apparatus 85 as shorter wavelength light can be continuously changed in a range from 425 nm to 435 nm. Accordingly, the tuning of the shorter wavelength light can be easily performed without any tuning circuit.

Also, it is preferred that the wavelength converting device 74 of the apparatus 81, 82, or 83 shown in FIG. 15, 16, or 17 be replaced with the wavelength converting device 88 to manufacture another apparatus.

In the first to fourth embodiments, the wavelength converting devices 46, 66, 68, 74, 86, and 88 are respectively formed of $LiTaO_3$. However, the substrate material of the devices is not limited to $LiTaO_3$. That is, it is preferred that the devices be respectively formed of an inorganic material having a non-linear polarization constant such as $LiNbO_3$ or $KTiOPO_4$. Also, it is preferred that the devices be respectively formed of an organic material having a non-linear polarization constant. In addition, in cases where the devices are formed of $KNbO_3$, shorter wavelength light having a narrow half band width can be generated because an allowed converting range of $KNbO_3$ is less than 0.2 nm in wavelength.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A shorter wavelength light generating apparatus, comprising:
    coherent light radiating means for initially radiating a required mode of coherent light and other various modes of coherent light, a wavelength of the required mode of coherent light differing from those of the other various modes of coherent light;
    light diffracting means for diffracting the required mode of coherent light radiated from the coherent light radiating means at a feedback angle of diffraction to feed back the required mode of coherent light diffracted to the coherent light radiating means and diffracting the other various modes of coherent light radiated from the coherent light radiating means at an abandoned angle of diffraction to abandon the other various modes of coherent light diffracted, the required mode of coherent light fed back to the coherent light radiating means inducing the coherent light radiating means to dominantly radiate the required mode of coherent light;
    wavelength converting means for converting a part of the required mode of coherent light dominantly radiated from the coherent light radiating means in cooperation with the light diffracting means into shorter wavelength light of which a wavelength is shorter than that of the required mode of coherent light, the wavelength converting means being composed of an optical waveguide type of wavelength converting device with an optical waveguide, alternate rows of reverse and non-reverse polarization layers being arranged at regular intervals in the optical waveguide of the optical waveguide type of wavelength converting device, the part of the required mode of coherent light being converted into the shorter wavelength light in the alternate rows of the optical waveguide, and the shorter wavelength light being output; and
    focusing means for focusing the required mode of coherent light dominantly radiated from the coherent light radiating means on the optical waveguide of the wavelength converting means to pass the required mode of coherent light through the alternate rows.

2. An apparatus according to claim 1 in which the light diffracting means is composed of a reflection type of diffraction grating in which a plurality of circular gratings are concentrically formed, the required mode of coherent light radiated from the wavelength converting device in conical shape being diffracted by the circular gratings to the coherent light radiating means, and the shorter wavelength light being diffracted by the circular gratings at an output angle of diffraction to output the shorter wavelength light.

3. An apparatus according to claim 1, additionally including collimating means for collimating the required mode of coherent light and the shorter wavelength light radiated from the optical waveguide type of wavelength converting device composing the wavelength converting means, and the light diffracting means is composed of a reflection type of diffraction grating in which a plurality of linear gratings are formed in parallel, the required mode of coherent light collimated by the collimating means being diffracted by the linear gratings to the coherent light radiating means, and the shorter wavelength light collimated by the collimating means being diffracted by the linear gratings at an output angle of diffraction to output the shorter wavelength light.

4. An apparatus according to claim 1, additionally including light separating means for separating the shorter wavelength light from the required mode of coherent light and the shorter wavelength light radiated from the wavelength converting means, the shorter wavelength light separated being output without being radiated to the light diffracting means, and the required mode of coherent light being radiated to the light diffracting means.

5. An apparatus according to claim 1 in which the required mode of coherent light radiated from the coherent light radiating means is a fundamental wave, and the shorter wavelength light converted in the wavelength converting means is a second harmonic wave of the required mode of coherent light, the wavelength of the second harmonic wave being half of that of the fundamental wave.

6. An apparatus according to claim 1 in which the coherent light radiating means is composed of a semiconductor laser from which a mode of coherent light agreeing with the required mode of coherent light fed back is radiated according to induced emission.

7. A shorter wavelength light generating apparatus for generating shorter wavelength light of which a wavelength is changeable, comprising:

a semiconductor laser for initially radiating various modes of coherent light including a required mode of coherent light, a wavelength of the required mode of coherent light differing from those of the other various modes of coherent light;

a reflection type of diffraction grating for diffracting the various modes of coherent light radiated from the semiconductor laser at various angles of diffraction and reflecting the various modes of coherent light diffracted;

a rotating base for adjustably inclining the reflection type of diffraction grating to selectively feed back the required mode of coherent light to the semiconductor laser, the required mode of coherent light fed back to the semiconductor laser inducing the semiconductor laser to dominantly radiate the required mode of coherent light; and wavelength converting device composed of a plurality of regions which each has a group of alternate rows of reverse and non-reverse polarization layers arranged at regular intervals, the regular intervals of a group of alternate rows differing from those of the other groups of alternate rows, and a part of the required mode of coherent light dominantly radiated from the semiconductor laser being converted into the shorter wavelength light in one of the groups of alternate rows.

8. An apparatus according to claim 7 in which the regular intervals in one of the groups of alternate rows arranged in the regions of wavelength converting device discretely vary from those in other groups of alternate rows.

9. An apparatus according to claim 7 in which the regular intervals in one of the groups of alternate rows arranged in the regions of wavelength converting device continuously vary from those in other groups of alternate rows.

10. An apparatus according to claim 7, additionally including:

a focusing lens for focusing the required mode of coherent light dominantly radiated from the semiconductor laser on tile wavelength converting device, the groups of alternate rows in the wavelength converting device being positioned in an optical waveguide, and the required mode of coherent light being focused on the optical waveguide of the wavelength converting device to pass the required mode of coherent light through the groups of alternate rows.

11. An apparatus according to claim 10 in which the reflection type of diffraction grating is provided with a plurality of circular gratings concentrically formed, the required mode of coherent light radiated from the wavelength converting device in conical shape being diffracted by the circular gratings, and the shorter wavelength light being diffracted by the circular gratings at an output angle of diffraction to output the shorter wavelength light.

12. An apparatus according to claim 10, additionally including a collimator lens for collimating the required mode of coherent light and the shorter wavelength light radiated from the wavelength converting device, and the reflection type of diffraction grating is provided with a plurality of linear gratings formed in parallel, the required mode of coherent light collimated by the collimator lens being diffracted by the linear gratings, and the shorter wavelength light collimated by the collimator lens being diffracted by the linear gratings at an output angle of diffraction to output the shorter wavelength light.

13. An apparatus according to claim 7 in which the reflection type of diffraction grating is provided with a plurality of circular gratings concentrically formed, the required mode of coherent light passing through the wavelength converting device while spreading in conical shape being diffracted by the circular gratings, and the shorter wavelength light being diffracted by the circular gratings at an output angle of diffraction to output the shorter wavelength light.

14. An apparatus according to claim 7, additionally including a collimator lens for collimating the required mode of coherent light dominantly radiated from the semiconductor laser, a part of the required mode of coherent light collimated by the collimator lens being converted into the shorter wavelength wave collimated, and the reflection type of diffraction grating is provided with a plurality of linear gratings formed in parallel, the required mode of coherent light passing through the wavelength converting device being diffracted by the linear gratings, and the shorter wavelength light converted in the wavelength converting device being diffracted by the linear gratings at an output angle of diffraction to output the shorter wavelength light.

15. An apparatus according to claim 7, additionally including a collimator lens for collimating the required mode of coherent light and the shorter wavelength light radiated from the wavelength converting device, and the reflection type of diffraction grating is provided with a plurality of linear gratings formed in parallel, the required mode of coherent light collimated by the collimator lens being diffracted by the linear gratings, and the shorter wavelength light collimated by the collimator lens being diffracted by the linear gratings at an output angle of diffraction to output the shorter wavelength light.

16. An apparatus according to claim 7, additionally including a dichroic mirror for separating the shorter wavelength light from the required mode of coherent light and the shorter wavelength light radiated from the wavelength converting device, the shorter wavelength light .separated being output without being radiated to the diffraction grating, and the required mode of coherent light being radiated to the diffraction grating.

17. An apparatus according to claim 7 in which the required mode of coherent light dominantly radiated from the semiconductor laser is a fundamental wave, and the shorter wavelength light converted in the wavelength converting device is a second harmonic wave of the required mode of coherent light, the wavelength of the second harmonic wave being half of that of the fundamental wave.

18. An apparatus according to claim 7 in which the material of the wavelength converting device is selected from the group consisting of $LiTaO_3$, $LiNbO_3$, $KTiOPO_4$, and $KNbO_3$.

19. A shorter wavelength light generating apparatus, comprising:

coherent light radiating means for initially radiating a required mode of coherent light and other various modes of coherent light, a wavelength of the required mode of coherent light differing from those of the other various modes of coherent light;

light diffracting means composed of a reflection type of diffraction grating for diffracting the required mode of coherent light radiated from the coherent light radiating means at a feedback angle of diffraction to feed back the required mode of coherent light diffracted to the coherent light radiating means and diffracting the other various modes of coherent light radiated from the coherent light radiating means at an abandoned angle of diffraction to abandon the other various modes of coherent light diffracted, a plurality of circular gratings being concentrically formed in the reflection type of diffraction grating, and the required mode of coherent light fed back to the coherent light radiating means inducing the coherent light radiating means to dominantly radiate the required mode of coherent light; and wavelength converting means for converting a part of the required mode of coherent light dominantly radiated from the coherent light radiating means in cooperation with the light diffracting means into shorter wavelength light of which a wavelength is shorter than that of the required mode of coherent light, the wavelength converting means being composed of a bulk element type of wavelength converting device in which alternate rows of reverse and non-reverse polarization layers are arranged at regular intervals, the required mode of coherent light passing through the bulk element type of wavelength converting device while spreading in conical shape being diffracted by the circular gratings of the reflection type of diffraction grating to the coherent light radiating means, and the shorter wavelength light converted in the bulk element type of wavelength converting device while spreading in conical shape being diffracted by the circular gratings at an output angle of diffraction to output the shorter wavelength light.

20. A shorter wavelength light generating apparatus, comprising:

coherent light radiating means for initially radiating a required mode of coherent light and other various modes of coherent light, a wavelength of the required mode of coherent light differing from those of the other various modes of coherent light;

light diffracting means composed of a reflection type of diffraction grating for diffracting the required mode of coherent light radiated from the coherent light radiating means at a feedback angle of diffraction to feed back the required mode of coherent light diffracted to the coherent light radiating means and diffracting the other various modes of coherent light radiated from the coherent light radiating means at an abandoned angle of diffraction to abandon the other various modes of coherent light diffracted, a plurality of linear gratings being formed in parallel in the reflection type of diffraction grating, and the required mode of coherent light fed back to the coherent light radiating means inducing the coherent light radiating means to dominantly radiate the required mode of coherent light;

wavelength converting means for converting a part of the required mode of coherent light dominantly radiated from the coherent light radiating means in cooperation with the light diffracting means into shorter wavelength light of which a wavelength is shorter than that of the required mode of coherent light, the wavelength converting means being composed of a bulk element type of wavelength converting device in which alternate rows of reverse and non-reverse polarization layers are arranged at regular intervals, the required mode of coherent light being diffracted by the linear gratings to the coherent light radiating means, and the shorter wavelength light converted in the bulk element type of wavelength converting device being diffracted by the linear gratings at an output angle of diffraction to output the shorter wavelength light; and collimating means for collimating the required mode of coherent light dominantly radiated from the coherent light radiating means, the required mode of coherent light collimated by the collimating means being radiated to the wavelength converting means.

21. A shorter wavelength light generating apparatus, comprising:

coherent light radiating means for initially radiating a required mode of coherent light and other various modes of coherent light, a wavelength of the required mode of coherent light differing from those of the other various modes of coherent light;

light diffracting means composed of a refection type of diffraction grating for diffracting the required mode of coherent light radiated from the coherent light radiating means at a feedback angle of diffraction to feed back the required mode of coherent light diffracted to the coherent light radiating means and diffracting the other various modes of coherent light radiated from the coherent light radiating means at an abandoned angle of diffraction to abandon the other various modes of coherent light diffracted, a plurality of linear gratings being formed in parallel in the reflection type of diffraction grating, and the required mode of coherent light fed back to the coherent light radiating means inducing the coherent light radiating means to dominantly radiate the required mode of coherent light;

wavelength converting means for converting a part of the required mode of coherent light dominantly radiated from the coherent light radiating means in cooperation with the light diffracting means into shorter wavelength light of which a wavelength is shorter than that of the required mode of coherent light, the wavelength converting means being composed of a bulk element type of wavelength converting device in which alternate rows of reverse and non-reverse polarization layers are arranged at regular intervals, the required mode of coherent light being diffracted by the linear gratings of the reflection type of diffraction grating to the coherent light radiating means, and the shorter wavelength light converted in the bulk element type of wavelength converting device being diffracted by the linear gratings at an output angle of diffraction to output the shorter wavelength light; and collimating means for collimating the required mode of coherent light and the shorter wavelength light radiated from the wavelength converting means, the required mode of coherent light and the shorter wavelength light collimated by the collimating means being radiated to the light diffracting means.

22. A shorter wavelength light generating apparatus, comprising:

coherent light radiating means for initially radiating a required mode of coherent light and other various modes of coherent light, a wavelength of the required mode of coherent light differing from those of the other various modes of coherent light;

light diffracting means for diffracting the required mode of coherent light radiated from the coherent light radiating means at a feedback angle of diffraction to feed back the required mode of coherent light diffracted to the coherent light radiating means and diffracting the other various modes of coherent light radiated from the coherent light radiating means at an abandoned angle of diffraction to abandon the other various modes of coherent light diffracted, the required mode of coherent light fed back to the coherent light radiating means inducing the coherent light radiating means to dominantly radiate the required mode of coherent light; and wavelength converting means for converting a part of the required mode of coherent light dominantly radiated from the coherent light radiating means in cooperation with the light diffracting means into shorter wavelength light of which a wavelength is shorter than that of the required mode of coherent light, the wavelength converting means being composed of an optical waveguide type of wavelength converting device in which alternate rows of reverse and non-reverse polarization layers are arranged at regular intervals in an optical waveguide, material of the optical waveguide type of wavelength converting device being selected from the group consisting of $LiTaO_3$, $LiNbO_3$, $KTiOPO_4$ and $KNbO_3$, and the shorter wavelength light being output from the wavelength converting means.

23. A shorter wavelength light generating apparatus comprising:

coherent light radiating means for initially radiating a required mode of coherent light and other various modes of coherent light, a wavelength of the required mode of coherent light differing from those of the other various modes of coherent light;

light diffracting means for diffracting the required mode of coherent light radiated from the coherent light radiating means at a feedback angle of diffraction to feed back the required mode of coherent light diffracted to the coherent light radiating means and diffracting the other various modes of coherent light radiated from the coherent light radiating means at an abandoned angle of diffraction to abandon the other various modes of coherent light diffracted, the required mode of coherent light fed back to the coherent light radiating means inducing the coherent light radiating means to dominantly radiate the required mode of coherent light; and wavelength converting means for converting a part of the required mode of coherent light dominantly radiated from the coherent light radiating means in cooperation with the light diffracting means into shorter wavelength light of which a wavelength is shorter than that of the required mode of coherent light, the wavelength converting means being composed of a bulk element type of wavelength converting device in which alternate rows of reverse and non-reverse polarization layers are arranged at regular intervals, material of the bulk element type of wavelength converting device being selected from the group consisting of $LiTaO_3$, $LiNbO_3$, $KTiOPO_4$ and $KNbO_3$, and the shorter wavelength light being output from the wavelength converting means.

24. An apparatus according to claim 2 in which the shorter wavelength light diffracted by the circular gratings of the light diffracting means includes zero-order diffraction light of the shorter wavelength light.

25. An apparatus according to claim 3 in which the shorter wavelength light diffracted by the linear gratings of the light diffracting means includes zero-order diffraction light of the shorter wavelength light.

26. An apparatus according to claim 11 in which the shorter wavelength light diffracted by the circular gratings of the reflection type of diffraction grating includes 26. (continued) zero-order diffraction light of the shorter wavelength light.

27. An apparatus according to claim 12 in which the shorter wavelength light diffracted by the linear gratings of the reflection type of diffraction grating includes zero-order diffraction light of the shorter wavelength light.

28. An apparatus according to claim 13 in which the shorter wavelength light diffracted by the circular gratings of the reflection type of diffraction grating includes zero-order diffraction light of the shorter wavelength light.

29. An apparatus according to claim 14 in which the shorter wavelength light diffracted by the linear gratings of the reflection type of diffraction grating includes zero-order diffraction light of the shorter wavelength light.

30. An apparatus according to claim 15 in which the shorter wavelength light diffracted by the linear gratings of the reflection type of diffraction grating includes zero-order diffraction light of the shorter wavelength light.

31. An apparatus according to claim 19 in which the shorter wavelength light diffracted by the circular gratings of the light diffracting means includes zero-order diffraction light of the shorter wavelength light.

32. An apparatus according to claim 20 in which the shorter wavelength light diffracted by the linear gratings of the light diffracting means includes zero-order diffraction light of the shorter wavelength light.

33. An apparatus according to claim 21 in which the shorter wavelength light diffracted by the linear gratings of the light diffracting means includes zero-order diffraction light of the shorter wavelength light.

* * * * *